(12) United States Patent
Hayashi et al.

(10) Patent No.: US 11,940,463 B2
(45) Date of Patent: Mar. 26, 2024

(54) PARTICLE MEASUREMENT DEVICE, THREE-DIMENSIONAL SHAPE MEASUREMENT DEVICE, PROBER DEVICE, PARTICLE MEASUREMENT SYSTEM, AND PARTICLE MEASUREMENT METHOD

(71) Applicant: Tokyo Seimitsu Co., Ltd., Hachioji (JP)

(72) Inventors: Natsumi Hayashi, Tsuchiura (JP); Hideki Morii, Tsuchiura (JP); Tetsuo Yoshida, Tokyo (JP); Toshiyuki Kimura, Tokyo (JP)

(73) Assignee: TOKYO SEIMITSU CO., LTD., Hachioji (JP)

( * ) Notice: Subject to any disclaimer, the term of this patent is extended or adjusted under 35 U.S.C. 154(b) by 0 days.

(21) Appl. No.: 18/459,132

(22) Filed: Aug. 31, 2023

(65) Prior Publication Data

US 2023/0417797 A1 Dec. 28, 2023

Related U.S. Application Data

(63) Continuation of application No. PCT/JP2022/008158, filed on Feb. 28, 2022.

(30) Foreign Application Priority Data

Mar. 2, 2021 (JP) ................. 2021-032413

(51) Int. Cl.
  *G01R 1/067* (2006.01)
  *G01R 1/073* (2006.01)

(52) U.S. Cl.
  CPC ...... *G01R 1/06711* (2013.01); *G01R 1/07314* (2013.01)

(58) Field of Classification Search
  CPC .................. G01R 1/07314; G01R 1/06711
  See application file for complete search history.

(56) References Cited

U.S. PATENT DOCUMENTS

| 2004/0145386 A1 | 7/2004 | Byun et al. |
| 2007/0076942 A1 | 4/2007 | Yatsugake et al. |

(Continued)

FOREIGN PATENT DOCUMENTS

| CN | 1777985 A | 5/2006 |
| CN | 101593714 A | 12/2009 |

(Continued)

OTHER PUBLICATIONS

Translation of JP H09306822 A (Year: 1997).*

(Continued)

*Primary Examiner* — Paresh Patel
(74) *Attorney, Agent, or Firm* — Birch, Stewart, Kolasch & Birch, LLP

(57) ABSTRACT

The particle measurement device includes: an acquiring unit configured to acquire pad surface shape data indicating a surface shape of an electrode pad including a probe needle mark where a probe needle has contacted; a roughness calculating unit configured to calculate volume of a recessed portion recessed from a pad reference surface and volume of a protruding portion protruding from the pad reference surface based on the pad surface shape data; and a particle quantity calculating unit configured to calculate a particle quantity from a volume difference between the volume of the recessed portion and the volume of the protruding portion.

20 Claims, 24 Drawing Sheets

(56) References Cited

U.S. PATENT DOCUMENTS

| | | |
|---|---|---|
| 2017/0292832 A1 | 10/2017 | Penjovic et al. |
| 2020/0191830 A1 | 6/2020 | Watanabe |
| 2021/0030314 A1 | 2/2021 | O'Connor et al. |

FOREIGN PATENT DOCUMENTS

| | | |
|---|---|---|
| CN | 103969267 A | 8/2014 |
| CN | 108132021 A | 6/2018 |
| CN | 108417516 A | 8/2018 |
| CN | 109786278 A | 5/2019 |
| CN | 111308302 A | 6/2020 |
| JP | 2003-68813 A | 3/2003 |
| JP | 2004-69645 A | 3/2004 |
| JP | 2005-134204 A | 5/2005 |
| JP | 2005-175094 A | 6/2005 |
| JP | 2006-190974 A | 7/2006 |
| JP | 2009-289818 A | 12/2009 |
| JP | 2014-175345 A | 9/2014 |
| JP | 2016-80564 A | 5/2016 |
| JP | 2016-161312 A | 9/2016 |

OTHER PUBLICATIONS

International Search Report for PCT/JP2022/008158 (PCT/ISA/210) dated May 24, 2022.

Written Opinion of the International Searching Authority for PCT/JP2022/008158 (PCT/ISA/237) dated May 24, 2022.

Korean Office Action for corresponding Korean Application No. 10-2023-7029600, dated Dec. 14, 2023, with English translation.

Chinese Notice of Allowance and Search Report for corresponding Chinese Application No. 202280018290.5, dated Jan. 3, 2024, with English translation.

\* cited by examiner

FIG.1
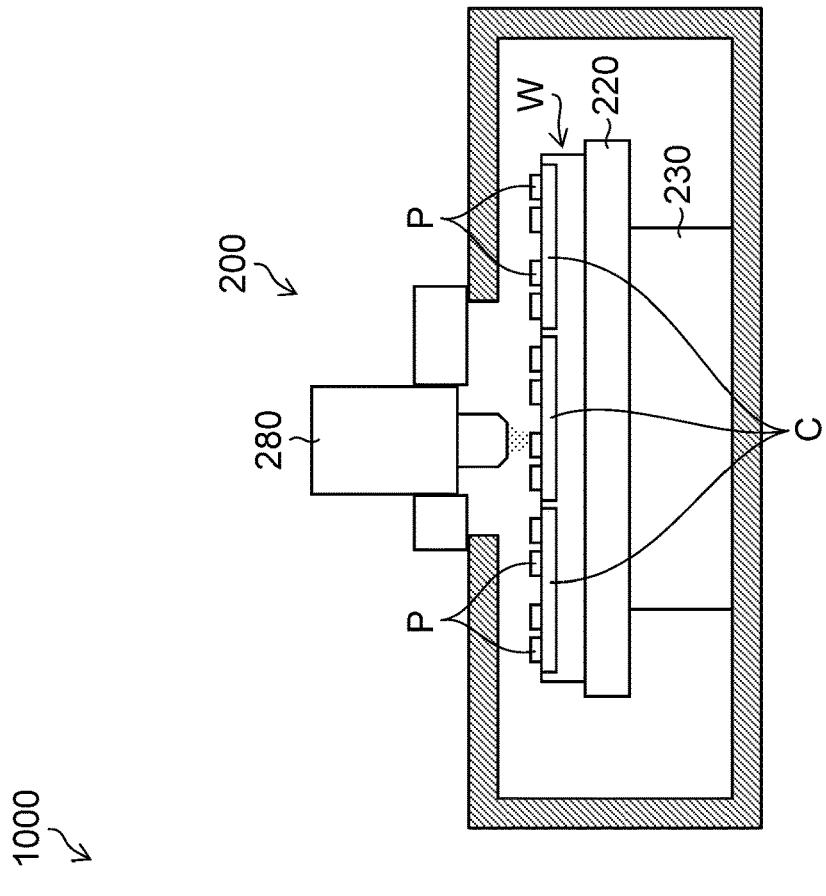
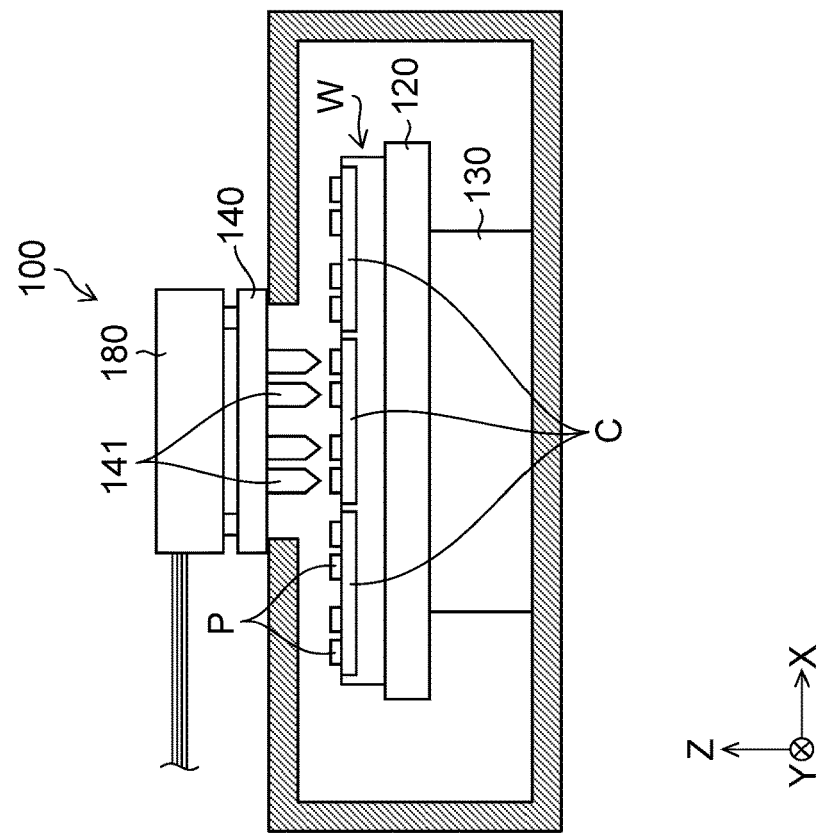

FIG.7

| | | | | | | | | | | | | | | | | | | | | | | | |
|---|---|---|---|---|---|---|---|---|---|---|---|---|---|---|---|---|---|---|---|---|---|---|---|
|1|3|3|-4|0|3|-2|1|2|-1|-2|3|0|5|-2|-2|3|0|1|0|-2|-1|0|1|-3|4|
|4|-3|-1|3|3|-5|-3|3|4|5|1|5|-2|5|2|-3|3|-1|-5|-3|0|3|-1|-3|0|1|
|-2|-3|-3|-4|-3|3|-4|-1|-1|3|-4|1|2|-2|2|0|-3|-3|-3|3|2|-3|5|5|-5|-4|
|1|-3|0|5|-5|-2|1|-1|-4|-4|0|3|4|-4|5|0|-1|3|-2|-3|-5|2|-3|2|-3|5|
|4|5|-2|-5|5|-5|3|0|-3|-2|-2|-4|1|-3|0|0|5|-1|4|-4|0|4|0|0|3|-3|
|2|2|5|-2|-3|5|-2|-2|1|2|-1|4|-2|-1|-2|4|-4|-5|5|2|4|5|-2|5|-5|-1|
|5|-2|-5|-5|4|2|1|4|5|4|0|0|-3|3|5|3|-3|-2|-5|2|-3|-1|3|-4|-3|2|
|-3|4|-1|2|-4|4|2|-3|2|3|-1|3|1|-2|2|0|-2|5|3|0|1|-3|-5|-4|1|2|
|4|-1|5|-3|1|-1|3|-5|-2|0|-4|-2|-2|1|3|5|-1|-1|5|-2|5|2|-3|5|3|-2|
|-5|-1|5|1|4|1|-2|-5|-1|5|-4|-10|-2|-5|3|5|0|2|3|-5|1|-1|0|0|-5|-3|
|-5|-3|3|-1|3|-1|-2|-4|10|-4|-15|-35|-25|-25|-4|-2|1|4|-2|2|1|5|2|3|-5|0|
|5|2|2|0|-1|-4|3|3|13|10|-10|-10|-30|-40|-35|-25|-3|-3|1|-3|-3|4|2|0|2|1|
|-3|-1|0|-2|1|0|3|10|20|25|-5|-20|-35| |-27|-20|-15|-10|1|3|-2|4|-4|-4|-1|-3|
|5|-3|-2|5|-5|0|1|20|50|35|-30|-45|-50|-55|-35|-30|-25|-20|-10|3|2|0|1|1|-1|-3|
|-3|3|3|-4|-3|2|4|1|10|20|-20|-25|-40|-35|-20|-20|-15|-10|2|1|-2|1|-5|1|5|-5|
|2|0|-5|-4|0|-3|5|0|5|10|-35|-30|-25|-20|-15|-15|-2|2|-5|1|3|-1|5|0|1|0|
|-5|-3|0|-5|-2|-3|-3|-3|-4|-1|1|-10|-15|0|1|-4|5|0|-2|5|-3|4|-3|-3|4|1|
|-5|-4|4|0|1|4|-3|-5|5|-5|-1|3|4|1|-3|-4|-1|-3|-3|3|3|2|0|-4|0|-5|
|2|-3|-4|-4|0|-3|-1|-4|1|-2|2|-3|-4|2|-1|-1|0|-5|0|-1|3|2|-1|4|-2|-2|
|5|4|4|-4|-3|-4|2|-2|5|-4|-4|1|3|0|-5|2|3|1|0|-1|-3|3|1|-3|-2|3|
|-5|5|-2|-4|4|5|-5|-3|-1|-5|-2|2|5|-2|-1|-3|-4|-1|-2|5|2|-5|1|3|-3|2|
|3|2|-5|4|3|5|1|1|1|1|-3|-2|0|2|3|-4|-3|5|5|-2|-3|-5|-3|3|4|1|
|2|5|1|0|3|1|-1|0|-4|-3|5|-3|-4|-1|-3|-5|0|0|-4|0|-1|1|2|-3|-5|-3|
|-5|0|-5|4|3|3|3|-5|-4|-5|-3|0|-5|5|1|0|-4|1|0|-2|2|-5|-5|3|0|-4|
|-5|3|3|-4|-4|1|4|-4|2|-3|-1|2|-3|0|-2|5|-4|2|4|1|4|-3|0|-3|3|5|
|3|-1|-5|1|-4|-2|-2|-2|4|3|-4|-4|-2|-4|-4|3|5|2|5|-2|2|-5|-4|-4|4|1|
|-4|-4|2|-3|5|0|4|5|-5|4|-2|0|2|-5|0|5|3|-2|1|-5|-2|-2|-4|-3|-5|4|

WAFER ID DATABASE 320

| WAFER ID | PROBER ID |
|---|---|
| 1001 | 1 |
| 2003 | 2 |
| ⋮ | |

ACCUMULATED VALUE DATABASE 330

| PROBER ID | ACCUMULATED VALUE $\Sigma\Delta V$ |
|---|---|
| 1 | .... |
| 2 | .... |
| 3 | .... |
| ⋮ | |

FIG.16

WAFER ID DATABASE 340

| WAFER ID | PROBE CARD ID |
|---|---|
| 1001 | 101 |
| 2003 | 201 |
| ⋮ | |

ACCUMULATED VALUE DATABASE 350

| PROBE CARD ID | ACCUMULATED VALUE |
|---|---|
| 101 | .... |
| 201 | .... |
| 301 | .... |
| ⋮ | |

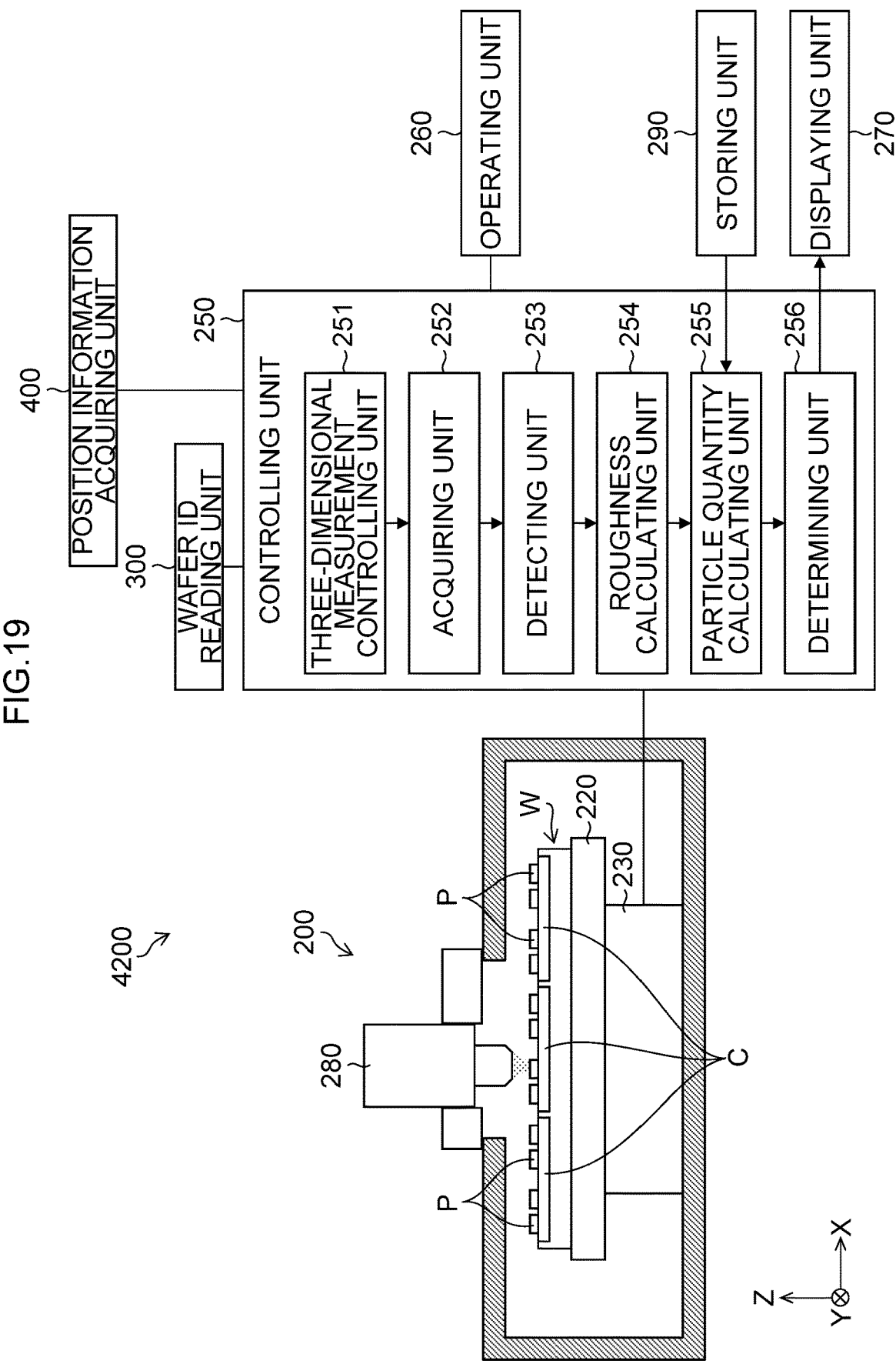

FIG.20

WAFER TYPE DATABASE 420

| WAFER ID | WAFER TYPE ID |
|---|---|
| 1001 | A |
| 2003 | B |
| ⋮ | |

NEEDLE DATABASE 430

| WAFER TYPE ID : A | WAFER TYPE ID : B |
|---|---|
| PAD ID: 1,XY COORDINATES,NEEDLEID: 1 | PAD ID: 1,XY COORDINATES,⋯ |
| PAD ID: 2,XY COORDINATES,NEEDLEID: 2 | PAD ID: 2,XY COORDINATES,⋯ |
| PAD ID: 3,XY COORDINATES,NEEDLEID: 2 | PAD ID: 3,XY COORDINATES,⋯ |
| PAD ID: 4,XY COORDINATES,NEEDLEID: 3 | PAD ID: 4,XY COORDINATES,⋯ |

ACCUMULATED VALUE DATABASE 440

| NEEDLE ID | ACCUMULATED VALUE $\Sigma\Delta V$ |
|---|---|
| 1 | …. |
| 2 | …. |
| 3 | …. |
| ⋮ | |

PARTICLE MEASUREMENT DEVICE, THREE-DIMENSIONAL SHAPE MEASUREMENT DEVICE, PROBER DEVICE, PARTICLE MEASUREMENT SYSTEM, AND PARTICLE MEASUREMENT METHOD

CROSS-REFERENCE TO RELATED APPLICATIONS

The present application is a Continuation of PCT International Application No. PCT/JP2022/008158 filed on Feb. 28, 2022 claiming priority under 35 U.S.C § 119(a) to Japanese Patent Application No. 2021-032413 filed on Mar. 2, 2021. Each of the above applications is hereby expressly incorporated by reference, in their entirety, into the present application.

BACKGROUND OF THE INVENTION

Field of the Invention

The presently disclosed subject matter relates to a technique for checking of electrical characteristics of a plurality of semiconductor chips formed on a semiconductor wafer.

Description of the Related Art

A semiconductor manufacturing process includes a large number of steps, and various inspections are performed in various manufacturing steps for quality assurance and improvement of yields. For example, in a phase where a plurality of semiconductor chips (hereinafter, referred to as chips) are formed on a semiconductor wafer (hereinafter, referred to as a wafer), wafer-level inspection is performed.

The wafer-level inspection is performed using a prober device that brings a large number of needle-shaped probes (hereinafter, referred to as probe needles) formed on a probe card into contact with their corresponding electrode pads of each chip. The probe needles are electrically connected to their corresponding terminals of a test head so that the test head can supply power and a test signal to each chip through the probe needles, and the test head detects an output signal from each chip to determine whether the chip operates normally.

There is disclosed a technique for capturing, with a camera, an image of a needle mark formed on an electrode pad and detecting the needle mark on the electrode pad from the captured image in order to determine whether the probe needle has normally contacted its corresponding electrode pad after the above-described wafer-level inspection is performed (for example, see PTL 1).

CITATION LIST

PTL 1: Japanese Patent Application Laid-Open No. 2009-289818

SUMMARY OF THE INVENTION

However, in the prober device, the probe needle scrapes a portion of a surface of the electrode pad when the probe needle contacts the electrode pad, and particles (fine particles) may be generated. These particles contain an oxide film, a metal film and the like which are formed on the surface of the electrode pad. If remaining on the wafer, the particles cause a malfunction of a circuit. Additionally, the particles may be attached to a tip of the probe needle and the like. In this case, the probe needle adversely affects the measurement of electrical characteristics.

Therefore, in the conventional prober device, to reduce an influence of particles generated when the probe needle contacts the electrode pad, for example, the number of times of probing operation (the number of times of contact of the probe needle) is counted, and when the number of times of probing operation reaches a predetermined number or when the result of the wafer-level inspection is degraded, the inside of the prober device is cleaned or the tip of the probe needle is cleaned.

However, a particle quantity in the prober device depends on kinematic conditions (for example, an amount of overdrive of a probe needle) at the time of the probing operation, and the correlation between the number of times of the probing operation and the actual particle quantity is low. Therefore, the problem of waste of time and insufficient cleaning arises because unnecessary cleaning is performed. It is too late to perform cleaning when the result of the wafer-level inspection has been degraded, resulting in a reduction in the inspection efficiency.

The technique disclosed in PTL 1 is merely a technique for detecting a needle mark on the electrode pad to determine whether the probe needle has normally contacted the electrode pad, and therefore it is difficult to grasp occurrences of particles generated in the prober device.

An object of the presently disclosed subject matter, which has been made in view of such circumstances, is to provide a particle measurement device, a three-dimensional shape measurement device, a prober device, a particle measurement system, and a particle measurement method which make it possible to grasp occurrences of particles generated when a probe needle contacts an electrode pad of a wafer.

In order to solve the aforementioned problems, a particle measurement device according to one aspect of the presently disclosed subject matter measures particles generated when a probe needle contacts an electrode pad of a wafer to check electrical characteristics of the wafer. The particle measurement device includes an acquiring unit configured to acquire pad surface shape data indicating a surface shape of the electrode pad including a probe needle mark where the probe needle has contacted, a detecting unit configured to detect a pad reference surface as a reference for measurement of the particles from a surface of the electrode pad based on the pad surface shape data acquired by the acquiring unit, a roughness calculating unit configured to calculate volume of a recessed portion recessed from the pad reference surface in the surface shape of the electrode pad and volume of a protruding portion protruding from the pad reference surface based on the pad surface shape data acquired by the acquiring unit, and a particle quantity calculating unit configured to calculate a particle quantity from a volume difference between the volume of the recessed portion and the volume of the protruding portion which are calculated by the roughness calculating unit. This makes it possible to grasp occurrences of particles generated when the probe needle contacts the electrode pad.

It is preferable that the particle measurement device further includes a first accumulating unit configured to accumulate particle quantities calculated by the particle quantity calculating unit for a plurality of the electrode pads included in the wafer, and a first outputting unit configured to output information (warning) indicating a possibility that an abnormality occurs in a check result based on a result obtained by comparing a particle accumulated value accumulated by the first accumulating unit and a first threshold.

The particle measurement device quantitatively manages the particle quantity and outputs the warning when there is a possibility that an abnormality occurs in a check result, and therefore an operator can properly clean the wafer requiring cleaning. Therefore, the efficiency of the manufacturing process of the semiconductor can be increased.

It is preferable that the particle measurement device further includes a second accumulating unit configured to accumulate a particle quantity for each prober device which has checked the electrical characteristics of the wafer, and a second outputting unit configured to output information indicating a prober device having a possibility that an abnormality occurs in a check result based on a result obtained by comparing a particle accumulated value accumulated for each prober device by the second accumulating unit and a second threshold.

The particle measurement device quantitatively manages the particle quantity for each prober device and outputs the warning for the prober device which has a possibility that an abnormality occurs in a check result, and therefore an operator can properly clean the prober device or the probe needle requiring cleaning. Therefore, the efficiency of the manufacturing process of the semiconductor can be increased.

It is preferable that the particle measurement device further includes a third accumulating unit configured to accumulate a particle quantity for each probe card used to check the electrical characteristics of the wafer, and a third outputting unit configured to output information indicating a probe card having a possibility that an abnormality occurs in a check result based on a result obtained by comparing a particle accumulated value accumulated for each probe card by the third accumulating unit and a third threshold.

The particle measurement device quantitatively manages the particle quantity for each probe card and outputs the warning for the probe card which has a possibility that an abnormality occurs in a check result, and therefore an operator can properly replace the probe card requiring replacement. Therefore, the efficiency of the manufacturing process of the semiconductor can be increased.

It is preferable that the particle measurement device further includes a fourth accumulating unit configured to accumulate a particle quantity for each probe needle included in a probe card used to check the electrical characteristics of the wafer, and a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

The particle measurement device quantitatively manages the particle quantity for each probe needle and outputs the warning for the probe needle which has a possibility that an abnormality occurs in a check result, and therefore an operator can properly clean the probe needle requiring cleaning in cleaning of the probe card. The probe card can be efficiently cleaned, and therefore the efficiency of the manufacturing process of the semiconductor can be further increased.

It is preferable that a three-dimensional shape measurement device includes a non-contact three-dimensional measuring unit configured to create pad surface shape data indicating a surface shape of an electrode pad including a probe needle mark where a probe needle has contacted, and the particle measurement device according to each embodiment of the presently disclosed subject matter.

It is preferable that a prober device includes a non-contact three-dimensional measuring unit configured to create pad surface shape data indicating a surface shape of an electrode pad including a probe needle mark where a probe needle has contacted, and the particle measurement device according to each embodiment of the presently disclosed subject matter. By mounting the particle measurement device in the prober device, the particles can be efficiently measured in a state where the wafer which has been subjected to checking is loaded into the prober device without being conveyed. Furthermore, recipes (various parameters such as the size of the wafer and the arrangement of the chips) used when the wafer is checked can be taken over and used, and therefore the particles can be efficiently measured from this standpoint.

It is preferable that a particle measurement system includes one or more prober devices configured to bring a probe needle into contact with an electrode pad of a wafer to check electrical characteristics of the wafer, a non-contact three-dimensional measurement device configured to create pad surface shape data indicating a surface shape of the electrode pad including a probe needle mark where the probe needle has contacted, and the particle measurement device according to each embodiment of the presently disclosed subject matter.

In order to solve the aforementioned problems, a particle measurement method according to another aspect of the presently disclosed subject matter measures particles generated when a probe needle contacts an electrode pad of a wafer to check electrical characteristics of the wafer. The particle measurement method includes acquiring pad surface shape data indicating a surface shape of the electrode pad including a probe needle mark where the probe needle has contacted, detecting a pad reference surface as a reference for measurement of the particles from a surface of the electrode pad based on the pad surface shape data, calculating volume of a recessed portion recessed from the pad reference surface in the surface shape of the electrode pad and volume of a protruding portion protruding from the pad reference surface based on the pad surface shape data, and calculating a particle quantity from a volume difference between the volume of the recessed portion and the volume of the protruding portion. This makes it possible to grasp occurrences of particles generated when the probe needle contacts the electrode pad.

According to the presently disclosed subject matter, it becomes possible to grasp occurrences of particles generated when the probe needle comes into contact with the electrode pad of the wafer to perform the electrical checking of the wafer.

BRIEF DESCRIPTION OF THE DRAWINGS

FIG. 1 is a schematic diagram of a particle measurement system according to a first embodiment;

FIG. 7 is a diagram illustrating an example of determination of a needle mark region and a method of detecting a pad reference surface;

FIG. 9 is a diagram illustrating a further example of a method of detecting the pad reference surface;

FIG. 13 is a diagram illustrating an example of databases in the second embodiment;

FIG. 16 is a diagram illustrating an example of databases in a third embodiment;

FIG. 19 is a schematic configuration diagram of a three-dimensional shape measurement device according to a fourth embodiment;

FIG. 20 is a diagram illustrating an example of databases in the fourth embodiment;

DESCRIPTION OF THE EMBODIMENTS

Figure 2:
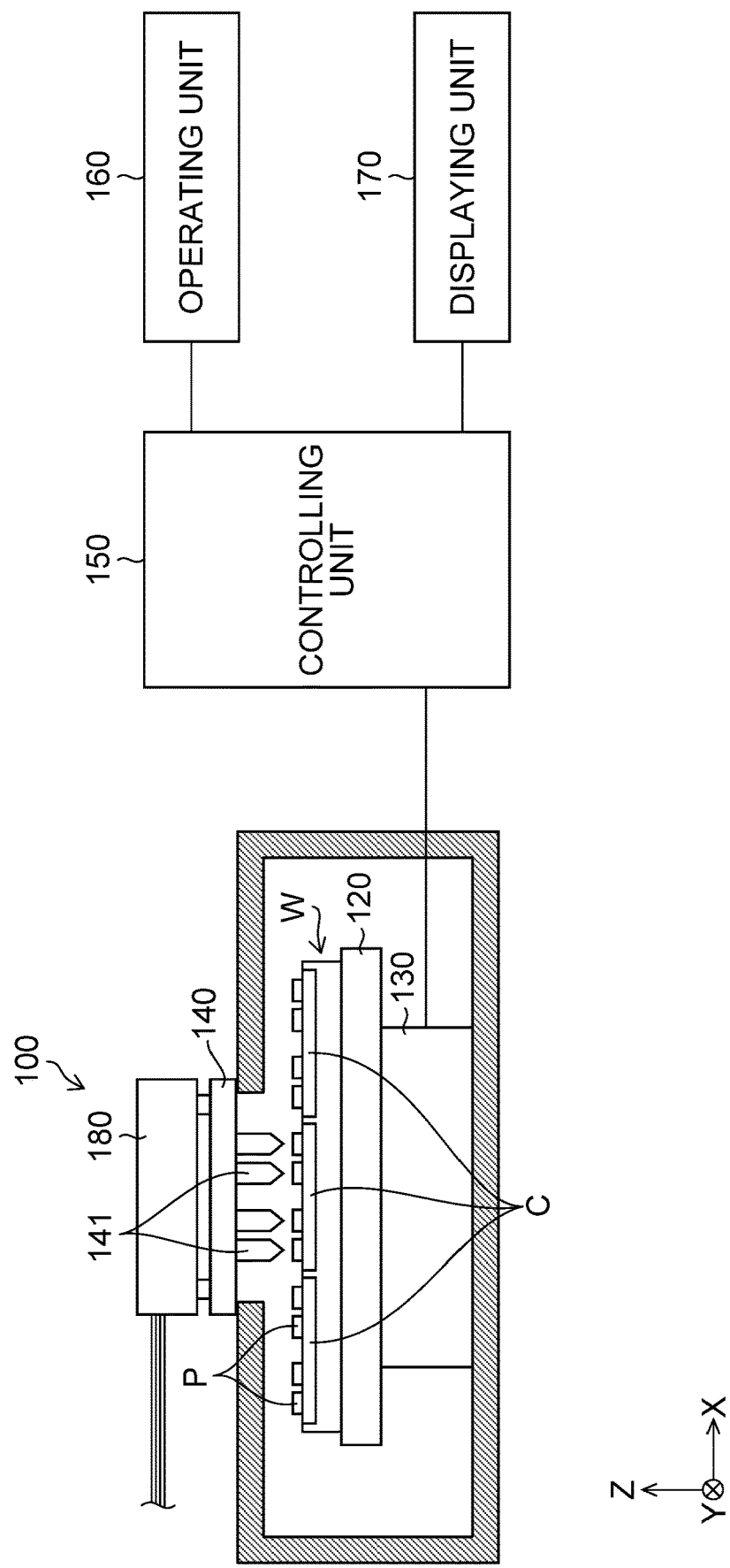
FIG. 2 is a schematic configuration diagram of a prober device according to the first embodiment.

Hereinafter, embodiments of the presently disclosed subject matter are described with reference to the drawings. In the following description, a member basically having the same configuration is designated by the same reference numeral or character.

First Embodiment

First, a particle measurement device according to a first embodiment of the presently disclosed subject matter is described. FIG. 1 is a configuration diagram of a particle measurement system 1000 according to the first embodiment. The particle measurement system 1000 includes a prober device 100 and a three-dimensional shape measurement device (particle measurement device) 200. A conveying device (not illustrated) that conveys a wafer W is provided between the prober device 100 and the three-dimensional shape measurement device 200. In FIG. 1, an X direction, a Y direction, and a Z direction are perpendicular to one another, and the X direction is a horizontal direction, the Y direction is a horizontal direction perpendicular to the X direction, and the Z direction is a vertical direction. The same is also applied to the other figures described later.

FIG. 2 is a schematic configuration diagram of the prober device 100. The prober device 100 includes a stage (including a chuck) 120, a stage moving mechanism 130, a probe card 140, a controlling unit 150, an operating unit 160, and a displaying unit 170.

The stage 120 has a holding surface (suction surface) capable of sucking the wafer W. The stage moving mechanism 130 supports a lower surface (surface on an opposite side to the holding surface) of the stage 120. The stage moving mechanism 130 is configured to be movable in the XYZ directions and rotatable in a θ direction (direction of rotation around the Z direction). Then, the use of the stage moving mechanism 130 enables the wafer W held under suction on the holding surface of the stage 120 to be movable in the XYZ directions and rotatable in the θ direction together with the stage 120.

The probe card 140 is provided at a position facing the stage 120, and is disposed parallel to the holding surface of the stage 120. The probe card 140 has a surface on which a plurality of probe needles 141 are formed, the surface facing the stage 120. Furthermore, the probe card 140 is connected to a tester main body (not illustrated) through a test head 180.

A plurality of chips C are formed on the wafer W, and each chip C includes one or more electrode pads P. The stage 120 is moved in the XYZ directions or is rotated in the θ direction by the stage moving mechanism 130 to align the wafer W with the probe card 140 so that each probe needle 141 is brought into contact with its corresponding electrode pad P.

The controlling unit 150 is implemented by, for example, a personal computer, a workstation, a programmable logic controller (PLC), or the like. The controlling unit 150 includes a central processing unit (CPU) that controls the operation of each unit of the prober device 100, a read only memory (ROM), a storage device (for example, a hard disk drive (HDD), a solid state drive (SDD), or the like) (not illustrated) that stores control programs, and a synchronous dynamic random access memory (SDRAM) that is usable as a work area of the CPU. The controlling unit 150 receives an operation input by an operator through the operating unit 160, and transmits a control signal according to the operation input to each unit of the prober device 100 to control the operation of each unit.

The operating unit 160 is means for receiving an operation input by an operator, and includes, for example, a keyboard, a mouse or a touch panel, and the like.

The displaying unit 170 is a device that displays an operation graphical user interface (GUI) for operating the prober device 100 and an image. As the displaying unit 170, for example, a liquid crystal display can be used.

After the prober device 100 brings the probe needles 141 into alignment and contact with their corresponding electrode pads P, the tester main body transmits an electric signal to the chip C through the test head 180, the probe card 140, and the probe needles 141 to check the electrical characteristics of the chip C on the wafer W. A result of checking the electrical characteristics is notified to an operator through the displaying unit 170.

After checking the electrical characteristics of each chip C on the wafer W is completed, the conveying device (not illustrated) conveys the wafer W from the prober device 100 to the three-dimensional shape measurement device 200.

Figure 3:
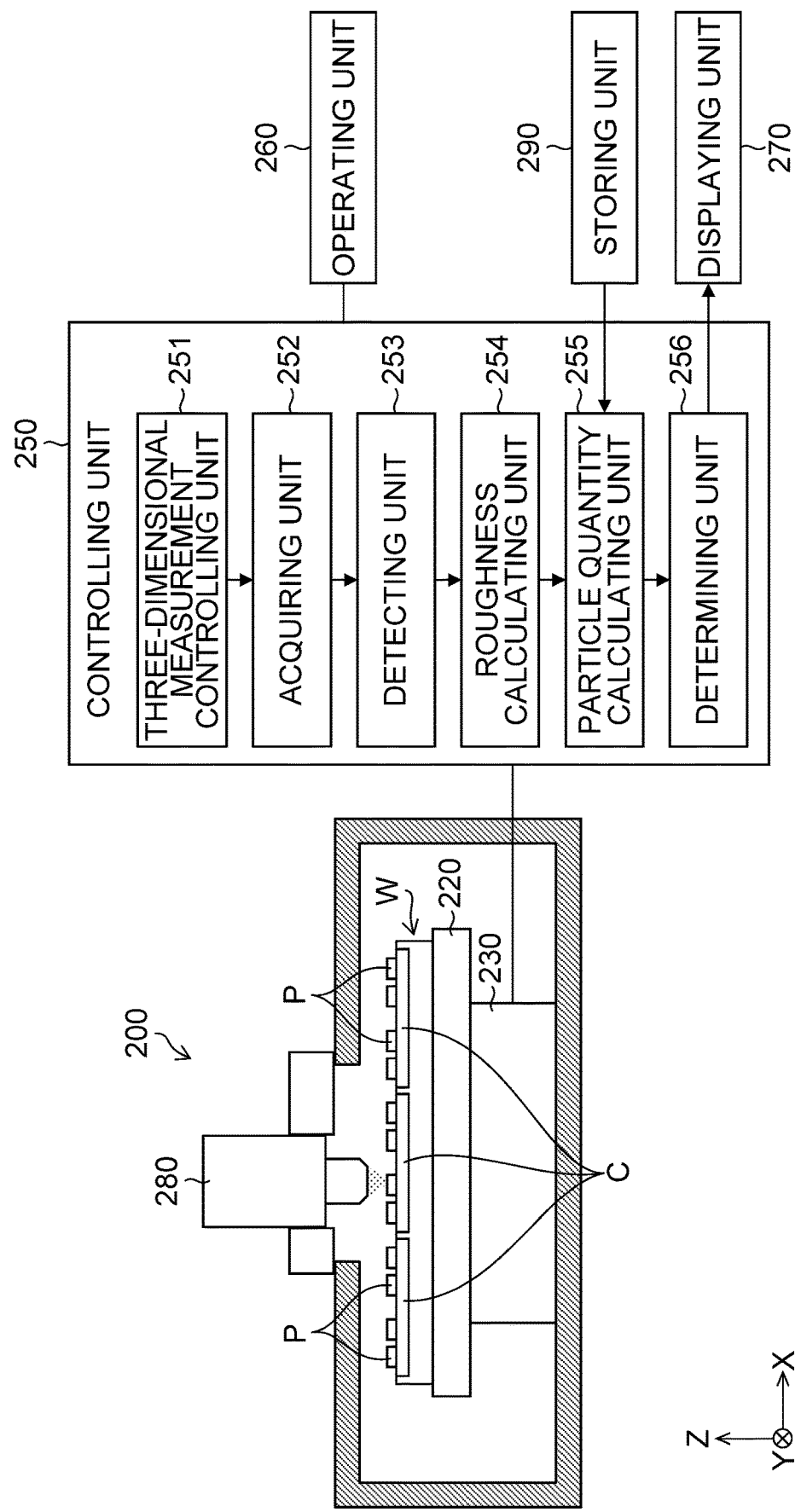
FIG. 3 is a schematic configuration diagram of a three-dimensional shape measurement device according to the first embodiment.

Next, a configuration of the three-dimensional shape measurement device 200 according to the first embodiment of the presently disclosed subject matter is described with reference to FIG. 3. The three-dimensional shape measurement device 200 includes a stage 220, a stage moving mechanism 230, a controlling unit 250, an operating unit 260, a displaying unit 270, a non-contact three-dimensional measuring unit 280, and a storing unit 290.

The stage 220 has a holding surface (suction surface) capable of sucking the wafer W. The stage moving mechanism 230 supports a lower surface (surface on an opposite side to the holding surface) of the stage 220. The stage moving mechanism 230 is configured to be movable in the XYZ directions and rotatable in a 0 direction (direction of rotation around the Z direction). Then, the use of the stage moving mechanism 230 enables the wafer W held under suction on the holding surface of the stage 220 to be movable in the XYZ directions and rotatable in the 0 direction together with the stage 220.

After checking the electrical characteristics of the chip C, a probe needle mark M (see FIG. 4) formed by the probe needle 141 remains on the surface of the electrode pad P. The non-contact three-dimensional measuring unit 280 measures a three-dimensional shape of the surface of the electrode pad P including the probe needle mark M in a non-contact manner, and stores, in the storing unit 290, the measurement result as pad surface shape data. Alternatively, the non-contact three-dimensional measuring unit 280 may output the pad surface shape data directly to the controlling unit 250.

The non-contact three-dimensional measuring unit 280 can adopt any measurement method. Examples of the measurement method include a white light interferometry method, a focus variation method, a spectral domain optical coherence tomography (SD-OCT) method, a Fourier domain optical coherence tomography (FD-OCT) method, a laser confocal method, a triangulation method, a light-section method, a pattern projection method, and an optical comb method.

In the present embodiment, as the non-contact three-dimensional measuring unit 280, a surface shape measurement device is suitably applied which three-dimensionally measures a surface shape of an object to be measured (in this example, the electrode pad P) in a non-contact manner using the white light interferometry method. The surface shape measurement device using the white light interferometry method uses white light (low-coherence light with less coherence) having a wide wavelength width as a light source, and measures a three-dimensional shape of a surface to be measured of an object to be measured in a non-contact manner using a Michelson interferometer or a Mirau interferometer. Such a surface shape measurement device is disclosed in, for example, Japanese Patent Application Laid-Open No. 2016-080564 and Japanese Patent Application Laid-Open No. 2016-161312, and is known, and therefore a detailed description thereof is omitted here.

The controlling unit 250 analyzes the pad surface shape data and calculates a quantity of particles (fine particles) generated in the prober device 100. The particles are generated when the probe needle 141 scrapes a portion (an oxide film, a metal film and the like) of a surface of the electrode pad P upon the probe needle 141 contacting the electrode pad P. The controlling unit 250 includes a three-dimensional measurement controlling unit 251, an acquiring unit 252, a detecting unit 253, a roughness calculating unit 254, a particle quantity calculating unit (corresponding to a particle quantity calculating unit and each accumulating unit of the presently disclosed subject matter) 255, and a determining unit (corresponding to each outputting unit of the presently disclosed subject matter) 256. In the narrow sense, the acquiring unit 252, the detecting unit 253, the roughness calculating unit 254, the particle quantity calculating unit 255, and the determining unit 256 correspond to the particle measurement device of the presently disclosed subject matter. In the broad sense, the entire three-dimensional shape measurement device 200 corresponds to the particle measurement device of the presently disclosed subject matter.

The operating unit 260 is means for receiving an operation input by an operator, and includes, for example, a keyboard, a mouse or a touch panel, and the like.

The displaying unit 270 is a device that displays an operation graphical user interface (GUI) for operating the three-dimensional shape measurement device 200 and an image. As the displaying unit 270, for example, a liquid crystal display can be used.

The three-dimensional measurement controlling unit 251 controls the three-dimensional measurement by the non-contact three-dimensional measuring unit 280. The acquiring unit 252 acquires the pad surface shape data indicating a three-dimensional shape of the surface of the electrode pad P from the non-contact three-dimensional measuring unit 280 or the storing unit 290. The detecting unit 253 detects a pad reference surface as a reference for measurement of particles based on the pad surface shape data acquired by the acquiring unit 252.

The roughness calculating unit 254 calculates the volume of a portion recessed from the pad reference surface and the volume of a portion protruding from the pad reference surface in the surface shape of the electrode pad P, based on the pad surface shape data acquired by the acquiring unit 252. Hereinafter, the portion recessed from the pad reference surface (i.e., a portion lower in height than the pad reference surface) is referred to as a recessed portion, and the portion protruding from the pad reference surface (i.e., a portion higher in height than the pad reference surface) is referred to as a protruding portion.

The particle quantity calculating unit 255 calculates a particle quantity from a volume difference between the volume of the protruding portion and the volume of the recessed portion which are calculated by the roughness calculating unit 254. The determining unit 256 accumulates the particle quantity calculated by the particle quantity calculating unit 255, and determines whether the accumulated value exceeds a predetermined threshold. The predetermined threshold is a preset value, and may be set when shipped or may be set or changed by the user.

The controlling unit 250 is implemented by, for example, a personal computer, a workstation, a programmable logic controller (PLC), or the like. The controlling unit 250 includes a central processing unit (CPU), a read only memory (ROM), a storage device (for example, a hard disk drive (HDD), a solid state drive (SDD), or the like) (not illustrated) that stores control programs, and a synchronous dynamic random access memory (SDRAM) that is usable as a work area of the CPU. The controlling unit 250 receives an operation input by an operator through the operating unit 260, and transmits a control signal according to the operation input to each unit of the three-dimensional shape measurement device 200 to control the operation of each unit.

The determination result by the determining unit 256 is output to the displaying unit 270. The user performs a necessary process such as cleaning of the wafer W, cleaning of the prober device 100, and cleaning of the probe needles 141 according to the display.

[Calculation Principle of Particle Quantity]

Figure 4:
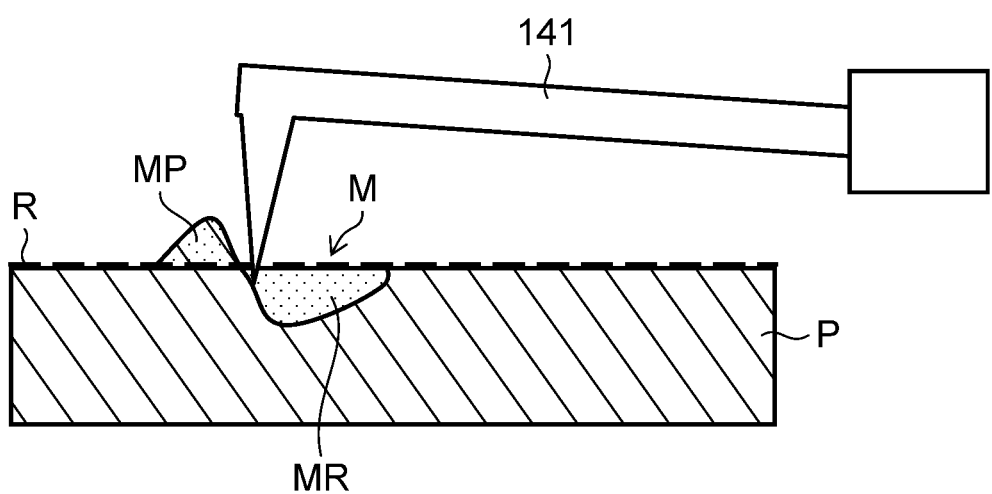
FIG. 4 is a diagram illustrating a calculation principle of a particle quantity.

Hereinafter, a calculation principle of a particle quantity in the presently disclosed subject matter is described with reference to FIG. 4. FIG. 4 schematically illustrates a probe needle mark M formed when the probe needle 141 scrapes a surface of a planar electrode pad P.

As illustrated in FIG. 4, the probe needle mark M has a protruding portion MP which is higher in height than a pad reference surface R of the electrode pad P and a recessed portion MR which is lower in height than the pad reference surface R of the electrode pad P. Note that the pad reference surface R can be detected from an average height of a region excluding a region where the probe needle mark M exists from the electrode pad P by the later-described method.

When particles are not separated from the electrode pad P, the volume VMR of the recessed portion MR is theoretically identical to the volume VMP of the protruding portion MP. Then, in the presently disclosed subject matter, the volume VMP of the protruding portion MP and the volume VMR of the recessed portion MR of the probe needle mark M are calculated based on the three-dimensional shape of the surface of the electrode pad P, and the difference between the two values is calculated as a particle quantity. Here, in order to accurately measure the volume VMP of the protruding portion MP and the volume VMR of the recessed portion MR, in the presently disclosed subject matter, the non-contact three-dimensional measuring unit 280 measures a three-dimensional shape of the surface of the electrode pad P including the probe needle mark M in a non-contact manner.

While FIG. 4 illustrates a cantilevered probe needle as an example of the probe needle 141, it is not intended to limit the probe needle 141. The presently disclosed subject matter is applicable to any type of probe needle 141. Examples of other types of probe needles 141 include a vertical needle which is a bar-like needle, and a crown needle which has a plurality of tips.

Furthermore, while FIG. 4 illustrates a planar electrode pad as an example of the electrode pad P, it is not intended to limit the electrode pad P. The presently disclosed subject matter is applicable to any type of electrode pad P. Examples of other types of electrode pads P include a bump pad having a convex curved surface (for example, a hemispherical shape). When the electrode pad P is a bump pad, the volume VMP of the protruding portion MP and the volume VMR of the recessed portion MR can be calculated by calculating a difference from the pad reference surface R having the global shape.

[Procedure for Measuring Particles]

Figure 5:
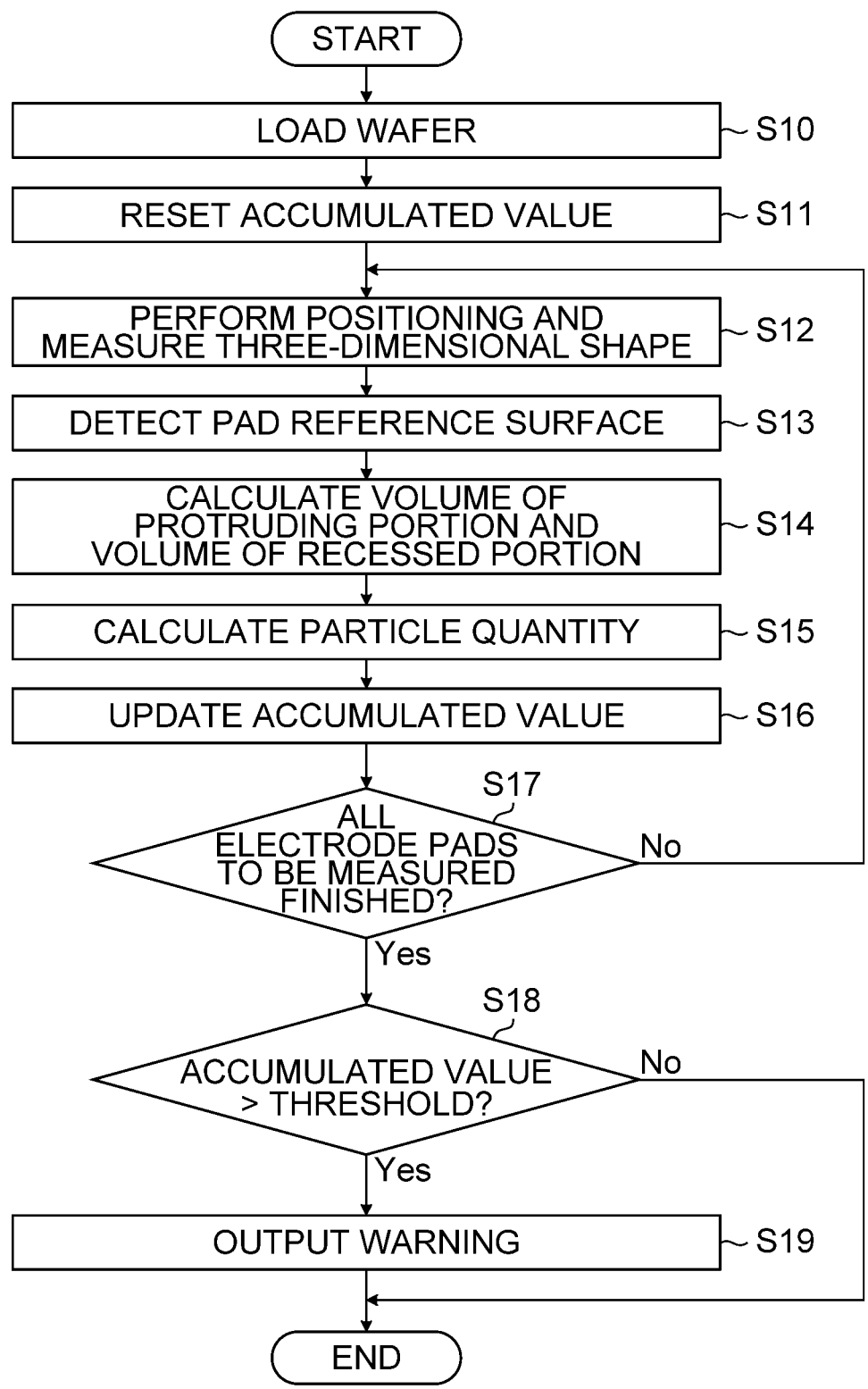
FIG. 5 is a flowchart illustrating an example of a procedure for measuring particles according to the first embodiment.

Next, a procedure for measuring particles in the first embodiment is described with reference to FIG. 5. First, a target wafer W is loaded into the three-dimensional shape measurement device 200. That is, the wafer W is placed (is held under suction) on the stage 220 of the three-dimensional shape measurement device 200 so that the non-contact three-dimensional measuring unit 280 and the wafer W on the stage 220 faces each other (step S10). Subsequently, the accumulated value ΣΔV is reset (step S11). The stage 220 is moved or rotated by the stage moving mechanism 230 for positioning between the non-contact three-dimensional measuring unit 280 and an electrode pad P to be measured. Furthermore, the non-contact three-dimensional measuring unit 280 measures a three-dimensional shape of a surface of the electrode pad P and converts it into a numerical value, and pad surface shape data is created (step S12).

Figure 6:
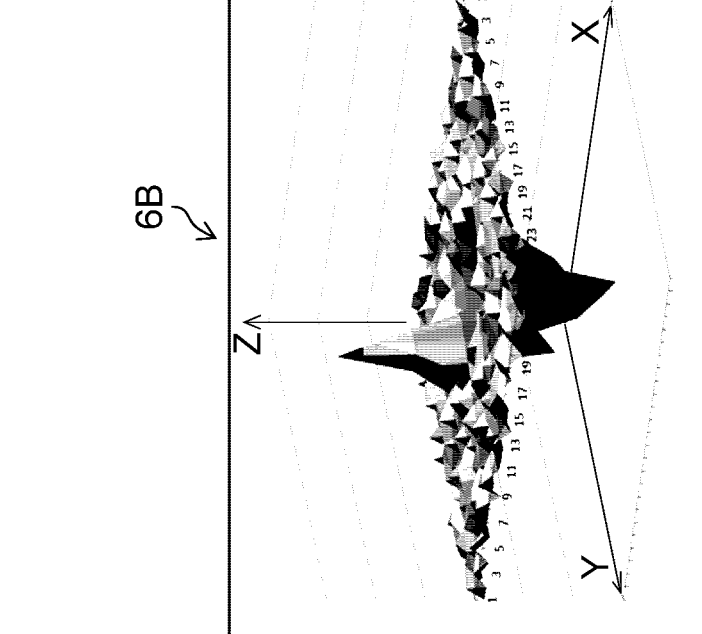
FIG. 6 is a diagram illustrating an example of pad surface shape data.

FIG. 6 illustrates an example of the pad surface shape data of the electrode pad P acquired by the non-contact three-dimensional measuring unit 280. FIG. 6 is the pad surface shape data indicating a needle mark M which is formed on a surface of the electrode pad P, the surface being approximately parallel to an XY plane. A numeral and character 6A of FIG. 6 is a graph illustrating positions (Z-axis coordinate values) in the height direction in respective XY coordinates on the XY plane, and the shade is darker as the absolute value of the Z-axis coordinate value of the pixel increases. A numeral and character 6B of FIG. 6 is a graph in which the graph indicated by the numeral and character 6A is expressed in the XYZ orthogonal coordinate system.

Subsequently, the acquiring unit 252 of the controlling unit 250 acquires the pad surface shape data directly from the non-contact three-dimensional measuring unit 280 or indirectly through the storing unit 290. The detecting unit 253 of the controlling unit 250 detects, from the surface of the electrode pad P, a pad reference surface R as a reference distinguished from the protruding portion and the recessed portion, based on the pad surface shape data acquired by the acquiring unit 252 (step S13).

More specifically, the detecting unit 253 specifies a needle mark region RM (see FIG. 7) which is a region around a pixel having a Z-axis coordinate value significantly different from Z-axis coordinate values of surrounding pixels in the pad surface shape data. Subsequently, the detecting unit 253 calculates an average value (average Z-axis coordinate value) of the Z-axis coordinate values in the region remaining after excluding the needle mark region RM from the pad surface shape data. Then, the detecting unit 253 detects the XY plane having the average Z-axis coordinate value as the pad reference surface R.

Here, the detecting unit 253 can determine the needle mark region RM using any known technique. For example, the detecting unit 253 may determine, as the needle mark region RM, a rectangular region surrounding pixels in which absolute values of the Z-axis coordinate values exceed a predetermined value and pixels within a predetermined distance from those pixels in the XY plane graph of the pad surface shape data. More specifically, for example, as illustrated in FIG. 7, the detecting unit 253 may determine, as the needle mark region RM, a rectangular region surrounding pixels in which absolute values of the Z-axis coordinate values exceed 10 and pixels adjacent to those pixels in the XY plane graph indicated by the numeral and character 6A of FIG. 6.

Figure 8:
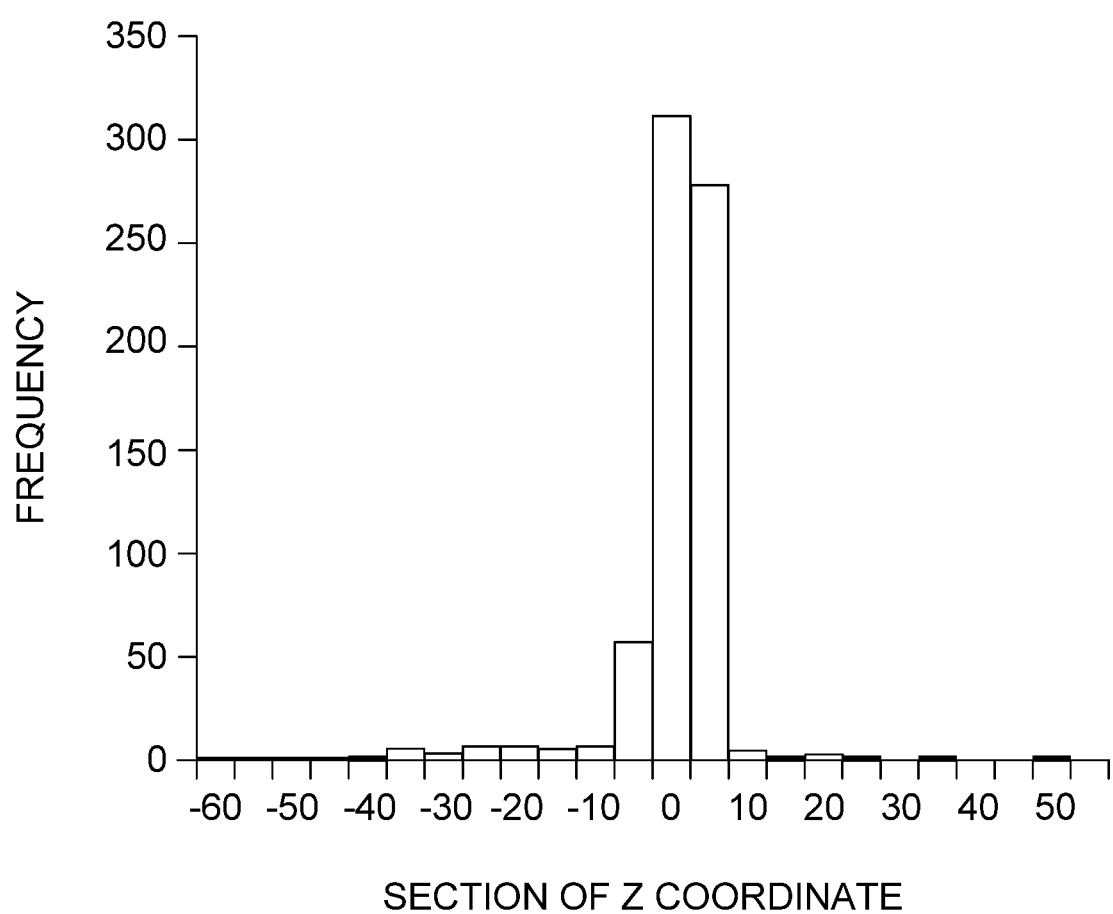
FIG. 8 is a diagram illustrating a further example of a method of detecting the pad reference surface.

For example, the detecting unit 253 may create a histogram illustrating frequencies of the Z-axis coordinate values of the pixels in the pad surface shape data and calculate the average Z-axis coordinate value for the pixels close to the most. FIG. 8 is a histogram illustrating frequencies of the Z-axis coordinate values, the histogram being created for the pad surface shape data illustrated in FIG. 7, in which the horizontal axis represents a Z-axis coordinate value and the vertical axis represents the number of pixels (frequency) having respective Z-axis coordinate values. The neighborhood of the Z-axis coordinate value 0 has the highest frequency in the histogram illustrated in FIG. 8, and therefore the detecting unit 253 calculates an average value of the Z-axis coordinate values for the pixels in which the Z-axis coordinate values are between −10 and +10. For example, the detecting unit 253 may determine, as the needle mark region RM, a region within a predetermined distance from the pixels having maximum and minimum Z-axis coordinate values.

There has been described above a method of detecting the pad reference surface R when the electrode pad P has a planar shape approximately parallel to the XY plane. Subsequently, there is described a method of detecting the pad reference surface R when the electrode pad P is inclined or has a shape other than the planar shape.

Figure 9:
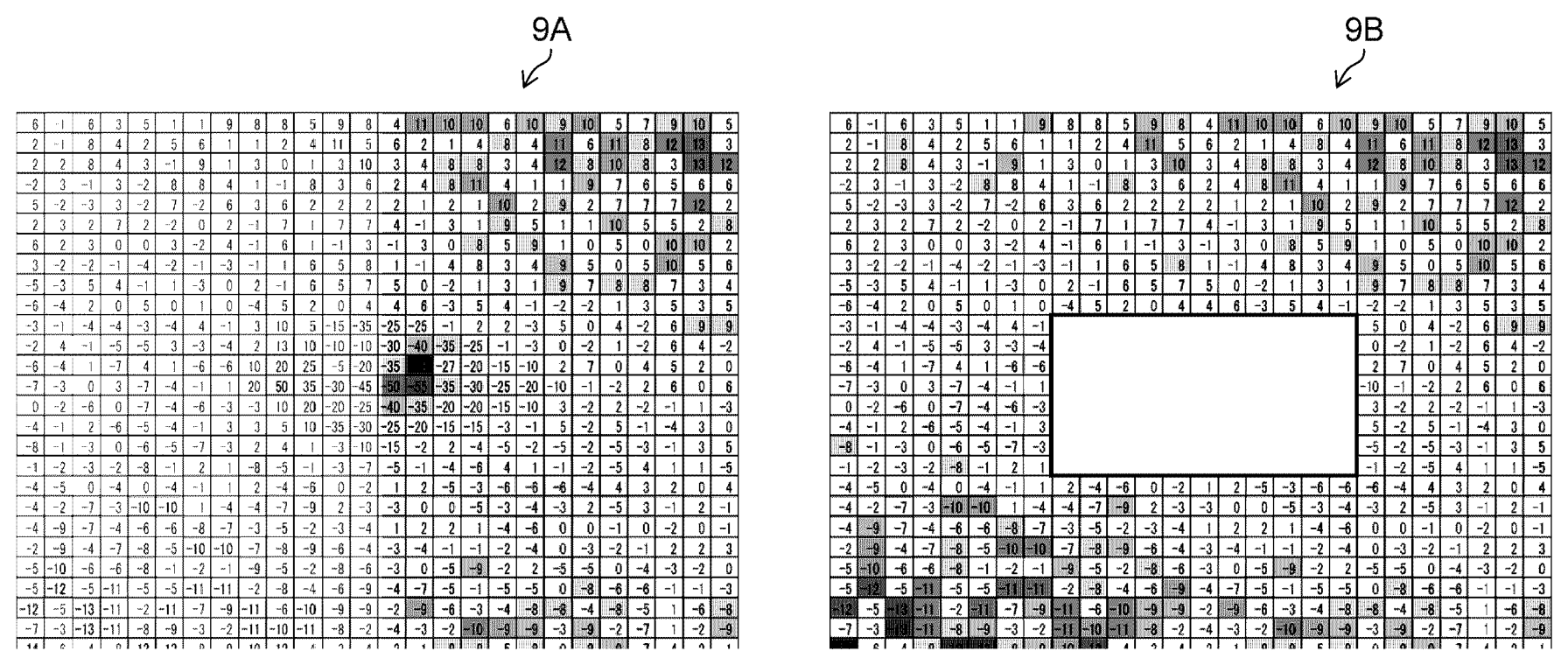

FIG. 9 illustrates an example of pad surface shape data obtained when the electrode pad P is inclined with respect to the XY plane, and a numeral and character 9A of FIG. 9 is a graph illustrating positions (Z-axis coordinate values) in the height direction in respective XY coordinates on the XY plane in the same manner as the numeral and character 6A of FIG. 6.

When the electrode pad P is inclined with respect to the XY plane or has a shape other than the planar shape, for example, the detecting unit 253 first excludes the needle mark region RM from the pad surface shape data by the method described using FIG. 7. Subsequently, the detecting unit 253 obtains an approximate expression representing the pad reference surface R by approximating the XYZ coordinate values of the remaining region (see the numeral and character 9B of FIG. 9) of the pad surface shape data using the least squares method. In the case of the graph indicated by the numeral and character 9B of FIG. 9, approximation results are as follows.

$$Z(X,Y)=aX+bY+c \quad a=0.2, b=1.0, c=4.2$$

Here, the method of detecting the pad reference surface R is not limited to the method exemplified above, and any known technique can be used.

When the pad reference surface R is detected by the detecting unit 253, the roughness calculating unit 254 of the controlling unit 250 calculates the volume VMR of the recessed portion MR and the volume VMP of the protruding portion MP with respect to the pad reference surface R for the region including the needle mark region RM in the electrode pad P, based on the pad surface shape data acquired by the acquiring unit 252 (step S14).

For example, when the electrode pad P is inclined or has a shape other than the planar shape, the roughness calculating unit 254 can calculate the volume VMR of the recessed portion MR and the volume VMP of the protruding portion MP using the approximate expression "Z(X, Y)=aX+bY+c" representing the pad reference surface R calculated by the detecting unit 253 and the following expressions (1) and (2).

[Expression 1]

$$VMP = \sum_{X,Y} \begin{cases} |Z(X, Y) - (aX + bY + c)| & (\text{if } Z(X, Y) - (aX + bY + c) > 0) \\ 0 & (\text{if } Z(X, Y) - (aX + bY + c) < 0) \end{cases} \quad (1)$$

[Expression 2]

$$VMR = \sum_{X,Y} \begin{cases} |Z(X, Y) - (aX + bY + c)| & (\text{if } Z(X, Y) - (aX + bY + c) < 0) \\ 0 & (\text{if } Z(X, Y) - (aX + bY + c) > 0) \end{cases} \quad (2)$$

Furthermore, when the pad reference surface R is not inclined, Z=aX+bY+c in the above expressions (1) and (2) can be replaced with the average Z-axis coordinate value (see the description of step S13), which is a constant, and therefore, the expressions (1) and (2) are simplified. The expressions after replacement are apparent, and therefore are not shown.

Subsequently, the particle quantity calculating unit 255 calculates a volume difference ΔV between the volume VMP of the protruding portion MP and the volume VMR of the recessed portion MR which are calculated by the roughness calculating unit 254 (step S15). The volume difference ΔV corresponds to a particle quantity from the electrode pad P which is currently being measured. Furthermore, the particle quantity calculating unit 255 adds the calculated volume difference ΔV to the accumulated value ΣΔV (step S16).

Subsequently, the particle quantity calculating unit 255 determines whether there are any more electrode pads P to be measured (step S17). For example, an operator (or a manufacturer) previously registers, with the storing unit 290, information for designating the electrode pads P to be measured, and the particle quantity calculating unit 255 makes the determination of step S17 based on the registered information. Alternatively, the particle quantity calculating unit 255 may make the determination of step S17 based on the input by the operator, whenever needed. Alternatively, the controlling unit 250 may automatically determine the electrode pads P to be measured according to a predetermined rule, and the particle quantity calculating unit 255 may make the determination of step S17 based on the determination by the controlling unit 250. The determination of the electrode pads P to be measurement is described later.

When it is determined that there are any more electrode pads P to be measured (step S17: NO), the process returns to step S12. When it is determined that there is no more electrode pads P to be measured (step S17: YES), the determining unit 256 determines whether the accumulated value ΣΔV is greater than a predetermined first threshold (step S18). When it is determined that the accumulated value ΣΔV is equal to or smaller than the predetermined first threshold (step S18: NO), the process for the wafer W ends.

When it is determined that the accumulated value ΣΔV is greater than the predetermined first threshold (step S18: YES), the determining unit 256 outputs, to the displaying unit 270, the information (hereinafter, referred to as warning) indicating a possibility that the quality of the chip C is affected (step S19). Upon receiving the warning, the operator cleans the wafer W as needed, and the process for the wafer W ends.

To date, there was no method of quantitatively managing a particle quantity, and therefore, the problem of waste of time and insufficient cleaning arises because unnecessary cleaning is performed.

On the other hand, the three-dimensional shape measurement device 200 according to the first embodiment quantitatively manages the particle quantity generated from the wafer W and outputs the warning when the particle quantity exceeds the predetermined threshold, which enables the operator to properly clean the wafer W requiring cleaning. Therefore, the efficiency of the manufacturing process of the semiconductor can be increased.

Modified Example of First Embodiment

In the first embodiment, the prober device 100 and the three-dimensional shape measurement device 200 are provided separately, and the particle measurement system 1000 includes the prober device 100 and the three-dimensional shape measurement device 200. However, by adding functions of the non-contact three-dimensional measuring unit 280 and the controlling unit 250 to the prober device 100, the prober device 100 and the particle measurement device can be accomplished by a single device.

In this case, after checking the electrical characteristics of each chip C on the wafer W is completed, the stage 120 is moved by the stage moving mechanism 130 from a position facing the probe card 140 to a position facing the non-contact three-dimensional measuring unit 280 while the wafer W is held under suction on the stage 120. Then, the non-contact three-dimensional measuring unit 280 measures a three-dimensional shape of the surface of the electrode pad P including a probe needle mark M in a non-contact manner. The subsequent steps are the same as those in the first embodiment. Furthermore, instead of moving the stage 120, the position of the stage 120 may be fixed to move the probe card 140 and the test head 180, and the non-contact three-dimensional measuring unit 280.

According to the modified example of the first embodiment, in addition to the effects achieved by the above-described first embodiment, the particle measurement device can be manufactured at low cost. Additionally, it is not necessary to convey the wafer W from the prober device 100 to the three-dimensional shape measurement device 200 and load the wafer W into the three-dimensional shape measurement device 200, which makes it possible to efficiently measure the particles. Furthermore, recipes (various parameters such as the size of the wafer W and the arrangement of the chips C) used when the wafer W is checked can be taken over and used, which makes it possible to measure the particles more efficiently than the first embodiment.

Second Embodiment

Next, a particle measurement device according to a second embodiment of the presently disclosed subject matter is described. In the first embodiment, the particle quantity is managed for the wafer W, which makes it possible to properly clean the wafer W requiring cleaning. However, in some cases, the electrical characteristics of the chips C on a plurality of wafers W are checked using a plurality of prober devices. In such a case, in the second embodiment, a single particle measurement device manages the particle quantity for each prober device, which makes it possible to properly clean the prober device requiring cleaning.

Figure 10:
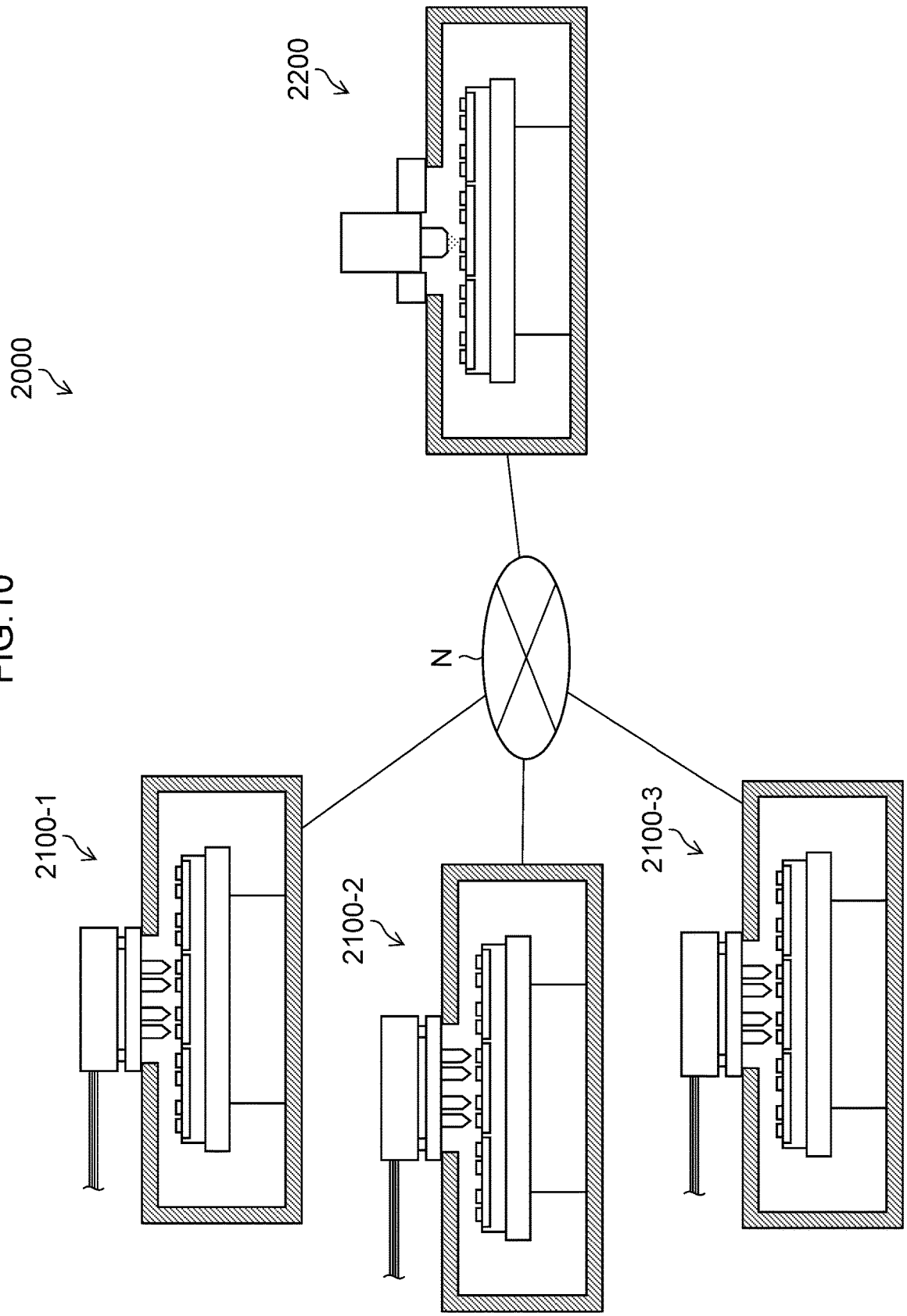
FIG. 10 is a schematic diagram of a particle measurement system according to a second embodiment.

FIG. 10 is a configuration diagram of a particle measurement system 2000 according to the second embodiment. The particle measurement system 2000 includes a plurality of prober devices 2100-$i$ ($i$ is a natural number greater than or equal to 1), and a three-dimensional shape measurement device 2200. The three-dimensional shape measurement device 2200 is connected mutually to the plurality of prober devices 2100-$i$ through a wired and/or wireless network N. Furthermore, conveying devices (not illustrated) that convey wafers W are provided between the three-dimensional shape measurement device 2200 and each of the plurality of prober devices 2100-$i$. While FIG. 10 illustrates three prober devices 2100-1, 2100-2, and 2100-3 as an example, it is not intended to limit the number of prober devices 2100-$i$.

Figure 11:
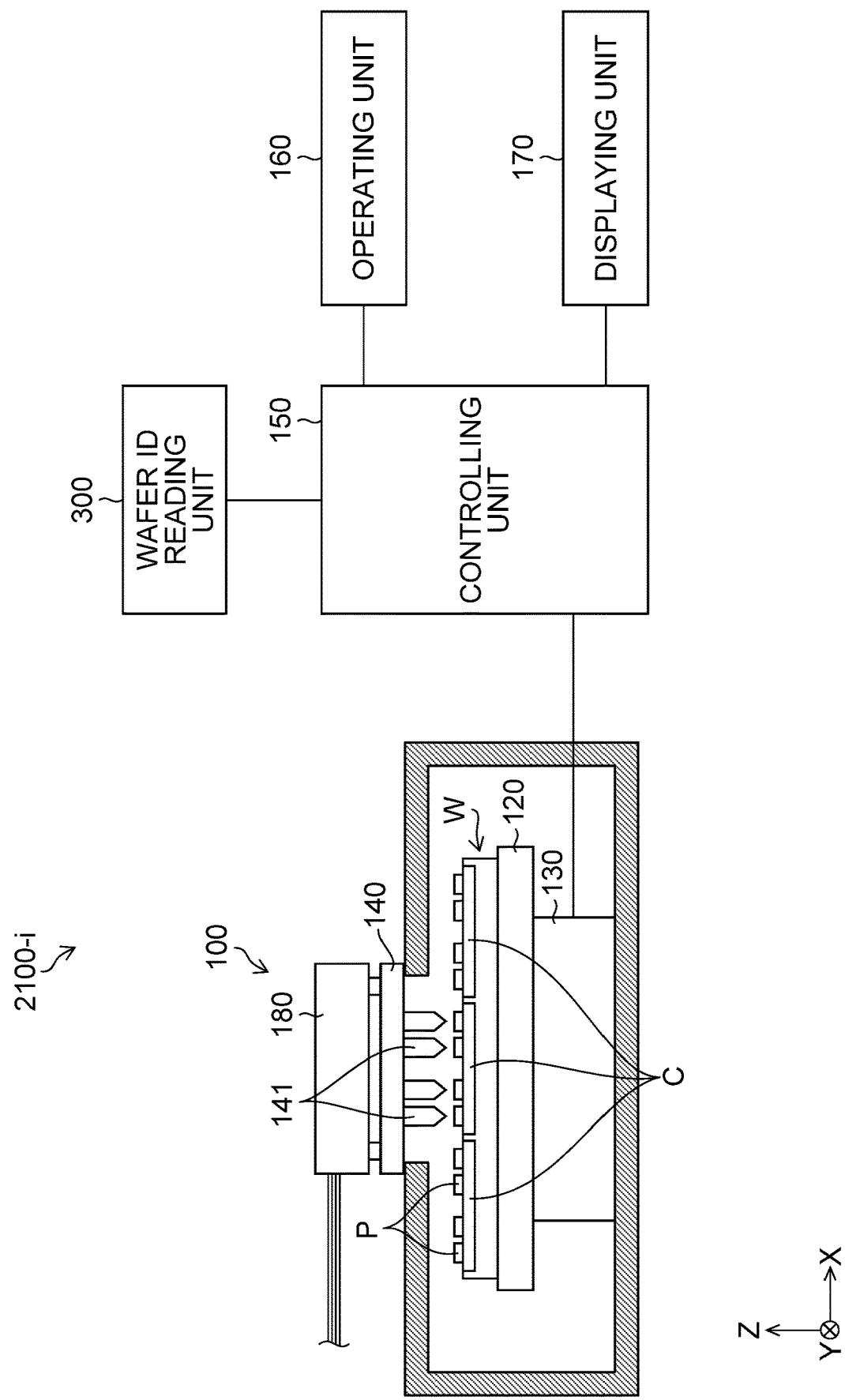
FIG. 11 is a schematic configuration diagram of a prober device according to the second embodiment.

Hereinafter, a configuration of each prober device 2100-$i$ is described with reference to FIG. 11. As illustrated in FIG. 11, the prober device 2100-$i$ is configured by further adding a wafer ID reading unit 300 to the prober device 100 illustrated in FIG. 2.

Each wafer W has a wafer ID which is information for identifying the wafer W. The wafer ID is assigned to each wafer W by, for example, printing, sculpting, a one-dimensional bar code, a two-dimensional bar code, RFID, an IC tag, or the like. The wafer ID reading unit 300 is provided according to the type of wafer ID, and reads a wafer ID assigned to each wafer W. For example, when the wafer ID is a two-dimensional bar code, the wafer ID reading unit 300 is a bar code reader. Any known technique can be used for the wafer ID and the wafer ID reading unit 300, and therefore description is omitted here.

Each prober device 2100-$i$ has a prober ID which is information for identifying the prober device 2100-$i$.

Figure 12:
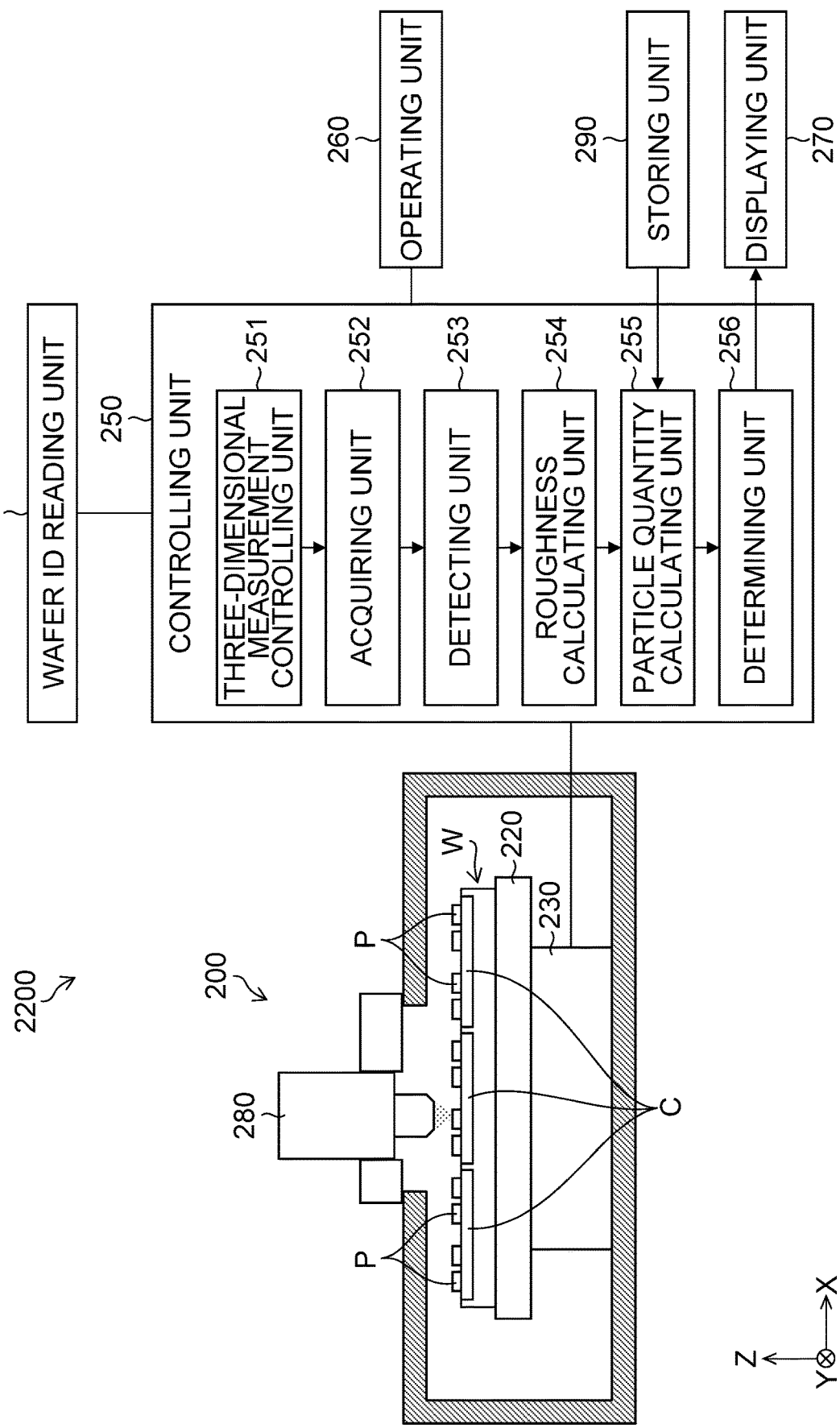
FIG. 12 is a schematic configuration diagram of a particle measurement device according to the second embodiment.

A configuration of the three-dimensional shape measurement device (particle measurement device) 2200 according to the second embodiment is described with reference to FIG. 12. As illustrated in FIG. 12, the three-dimensional shape measurement device 2200 has a configuration obtained by further adding a wafer ID reading unit 310 to the configuration of the three-dimensional shape measurement device 200 illustrated in FIG. 3. The wafer ID reading unit 310 is the same as the wafer ID reading unit 300, and therefore the description of the wafer ID reading unit 310 is omitted here.

In the second embodiment, the controlling unit 250 of the three-dimensional shape measurement device 2200 manages, in databases, a particle quantity for each prober device 2100-$i$. FIG. 13 illustrates an example of the databases stored in the storing unit 290. As illustrated in FIG. 13, the storing unit 290 includes a wafer ID database 320 and an accumulated value database 330. The wafer ID database 320 stores a wafer ID for identifying a wafer W and a prober ID for identifying a prober device 2100-$i$ used when the wafer W is checked while associating the wafer ID with the prober ID. The accumulated value database 330 stores an accumulated value $\Sigma\Delta V$ of the particle quantity for each prober device 2100-$i$.

Figure 14:
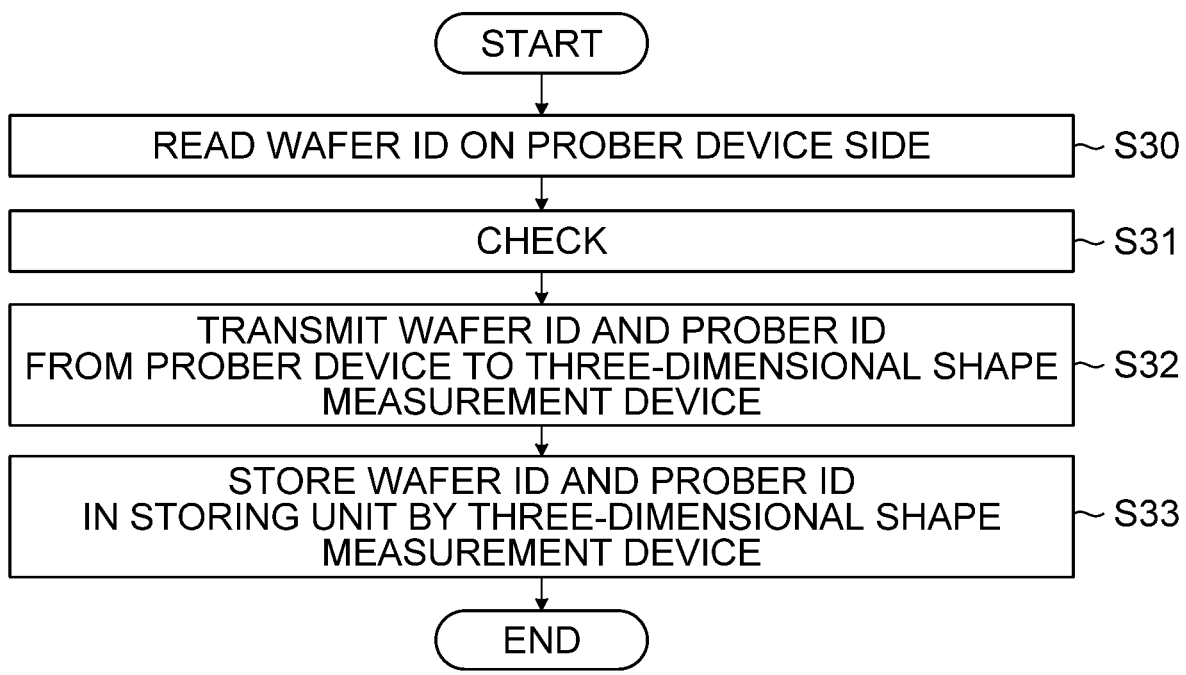
FIG. 14 is a flowchart illustrating an example of a procedure for measuring particles according to the second embodiment.
Figure 15:
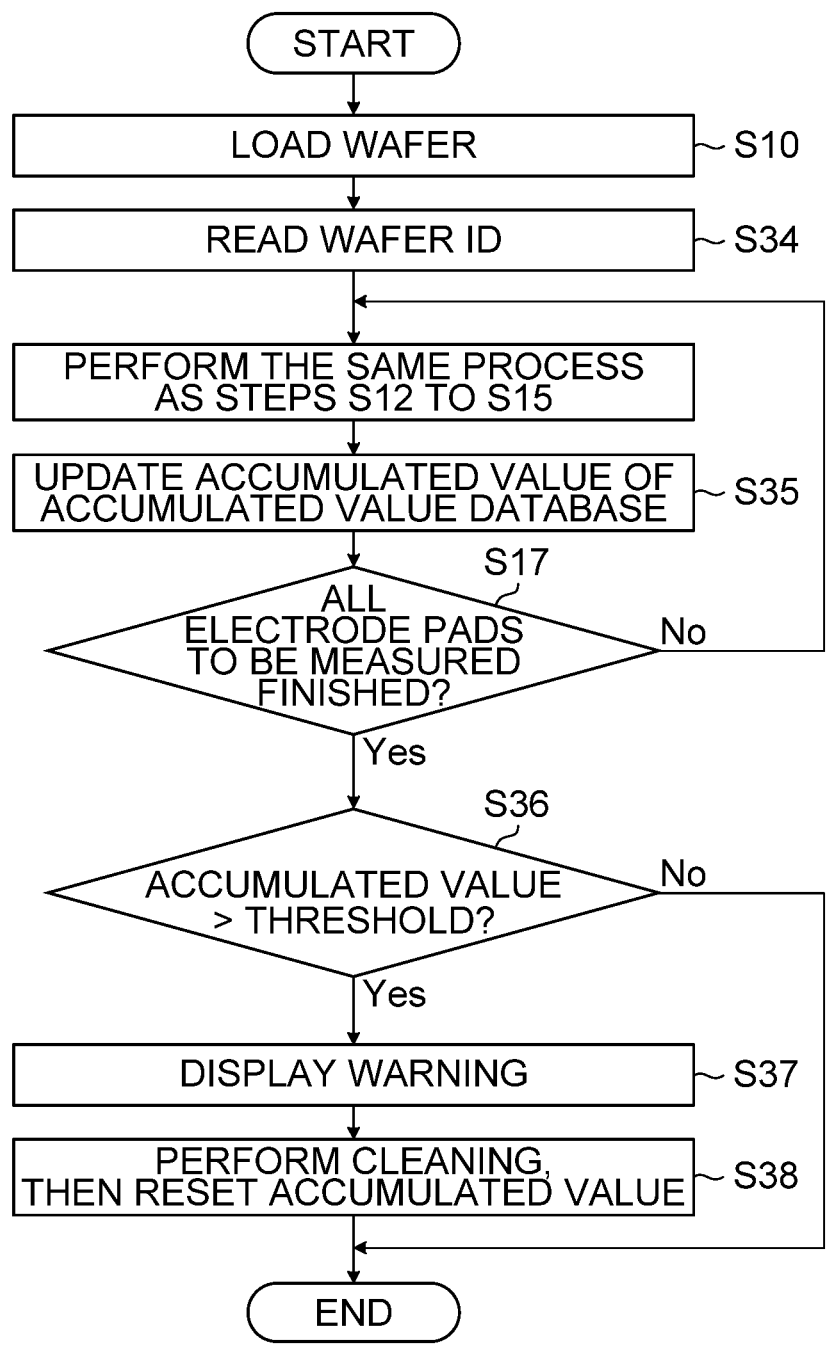
FIG. 15 is a flowchart illustrating an example of a procedure for measuring particles according to the second embodiment.

Next, a procedure for measuring particles in the second embodiment is described with reference to FIGS. 14 and 15. In the second embodiment, the wafer ID is registered prior to the particle measurement. Hereinafter, a procedure for registering the wafer ID is described with reference to FIG. 14.

First, when each prober device 2100-$i$ performs the probing operation, the wafer ID reading unit 300 of the prober device 2100-$i$ reads the wafer ID from the wafer W (step S30). Subsequently, each prober device 2100-$i$ performs the probing operation for the wafer W, and further checks the wafer W (step S31). When the checking is completed, the prober device 2100-$i$ transmits the wafer ID of the wafer W read in step S30 and the prober ID of the prober device 2100-$i$ to the three-dimensional shape measurement device 2200 (step S32). The three-dimensional shape measurement device 2200 stores the received wafer ID and the prober ID in association with each other in the wafer ID database 320 in the storing unit 290 (step S33). The databases as illustrated in FIG. 13 are created by the registration procedure.

Subsequently, the wafer W which has been subjected to checking is conveyed to the three-dimensional shape measurement device 2200 by the conveying device (not illustrated), and the particles are measured for the wafer W.

Subsequently, the particle measurement in the second embodiment is described with reference to FIG. 15. As illustrated in FIG. 15, in the second embodiment, steps S11, S16, and S18 to S19 in the first embodiment illustrated in FIG. 5 are replaced with steps S34, S35, and S36 to S38, respectively. Other steps in FIG. 15 are the same as steps S12 to S15 in FIG. 5 of the first embodiment, and therefore the description thereof is omitted here.

First, when the wafer W is conveyed to the three-dimensional shape measurement device 2200 and is loaded into the three-dimensional shape measurement device 2200 (step S10), the wafer ID reading unit 310 of the three-dimensional shape measurement device 2200 reads the wafer ID from the wafer W (step S34). Next, similarly to the first embodiment, steps S12 to S15 are performed, and the particle quantity ΔV is calculated.

Subsequently, when the particle quantity ΔV is calculated (step S15), the particle quantity calculating unit 255 of the controlling unit 250 acquires the prober ID associated with the wafer ID read in step S34 from the wafer ID database 320 in the storing unit 290. Subsequently, the particle quantity calculating unit 255 refers to the accumulated value database 330 in the storing unit 290, and adds the particle quantity ΔV calculated in step S15 to the accumulated value ΣΔV corresponding to the acquired prober ID to update the accumulated value ΣΔV (step S35).

Then, when it is determined that there is no more electrode pads P to be measured (step S17: YES), a determining unit 256 determines whether the accumulated value ΣΔV calculated in step S35 exceeds a predetermined second threshold (step S36).

Here, in the first embodiment, the particle quantity is managed for the wafer W, but in the second embodiment, the particle quantity is managed for each prober device 2100-*i*, and therefore the second threshold used in step S36 of the second embodiment does not need always to coincide with the first threshold used in the first embodiment.

The second threshold is a preset value, similarly to the first threshold. The second threshold may be set as appropriate when shipped or may be set or changed as appropriate at any time by the user. When a certain amount or more of particles are accumulated in the prober device 2100-*i*, it may affect the checking of the wafer W, but the operator (or the manufacturer) can empirically know the particle quantity which may affect the checking based on the use experience of the prober device 2100-*i*. Therefore, the operator may set the second threshold based on his/her experience.

When it is determined, in step S36, that the accumulated value ΣΔV exceeds the predetermined second threshold, the determining unit 256 outputs, to the displaying unit 270, the prober ID acquired in step S35, the information for specifying the prober device 2100-*i* corresponding to the prober ID, and the warning (step S37). Upon receiving the warning, the operator cleans the prober device 2100-*i* as needed. When the cleaning is performed, the determining unit 256 resets the accumulated value ΣΔV corresponding to the cleaned prober device 2100-*i*, the accumulated value ΣΔV being stored in the accumulated value database 330 (step S38), and then, the process for the wafer W ends.

To date, there was no method of quantitatively managing a particle quantity, and therefore, the prober device 2100-*i* not originally requiring cleaning is cleaned, or conversely, insufficient cleaning of the prober device 2100-*i* is caused. This leads to a reduction in efficiency of the manufacturing process of the semiconductor.

On the other hand, the three-dimensional shape measurement device 2200 according to the second embodiment of the presently disclosed subject matter quantitatively manages the particle quantity generated from the wafer W for each prober device 2100-*i*, and outputs the warning encouraging cleaning of the prober device 2100-*i* in which the particle quantity exceeds the predetermined second threshold. This enables the operator to properly clean the prober device 2100-*i* requiring cleaning. Therefore, the efficiency of the manufacturing process of the semiconductor can be increased.

Modified Example of Second Embodiment

In the second embodiment, upon receiving the warning, the operator cleans the prober device 2100-*i* as needed, but the warning may be output at timing different from that of the second embodiment by appropriately changing the second threshold to be used in step S36. In the modified example of the second embodiment, to encourage cleaning of the probe needles 141 of the probe card 140 mounted in the prober device 2100-*i* instead of cleaning of the prober device 2100-*i*, the second threshold may be adjusted to another threshold. According to the modified example of the second embodiment, the operator can properly clean the probe needles 141 requiring cleaning. Therefore, the efficiency of the manufacturing process of the semiconductor can be increased.

Third Embodiment

In the second embodiment, the particle quantity is managed for each prober device, thereby determining a necessity of cleaning the prober device. However, in some cases, a plurality of probe cards are used for a single prober device. In a third embodiment, the particle quantity is managed for each probe card mounted in the prober device, which makes it possible to properly replace the probe card.

A particle measurement system (not illustrated) according to the third embodiment includes the prober device 2100 and the three-dimensional shape measurement device 2200 according to the second embodiment. The prober device 2100 and the three-dimensional shape measurement device 2200 have the same configurations as those in the second embodiment, and therefore the description thereof is omitted here.

In the third embodiment, each probe card 140-*j* (j is a natural number greater than or equal to 1) has a probe card ID which is information for identifying the probe card. When the probe card 140-*j* is mounted, the prober device 2100 acquires the probe card ID of the probe card 140-*j*. The probe card ID is acquired by, for example, input by the operator. Alternatively, a reading unit (not illustrated) of each prober device 2100-*i* may automatically read the probe card ID from the probe card 140-*j* in the same manner as the above-described wafer ID.

FIG. 16 illustrates an example of databases stored in the storing unit 290 in the third embodiment. As illustrated in FIG. 16, in the third embodiment, the storing unit 290 includes a wafer ID database 340 and an accumulated value database 350. The wafer ID database 340 stores a wafer ID for identifying a wafer W and a probe card ID for identifying a probe card 140-*j* used when the wafer W is checked while associating the wafer ID with the prober ID. The accumulated value database 350 stores an accumulated value ΣΔV of the particle quantity for each probe card 140-*j*.

Figure 17:
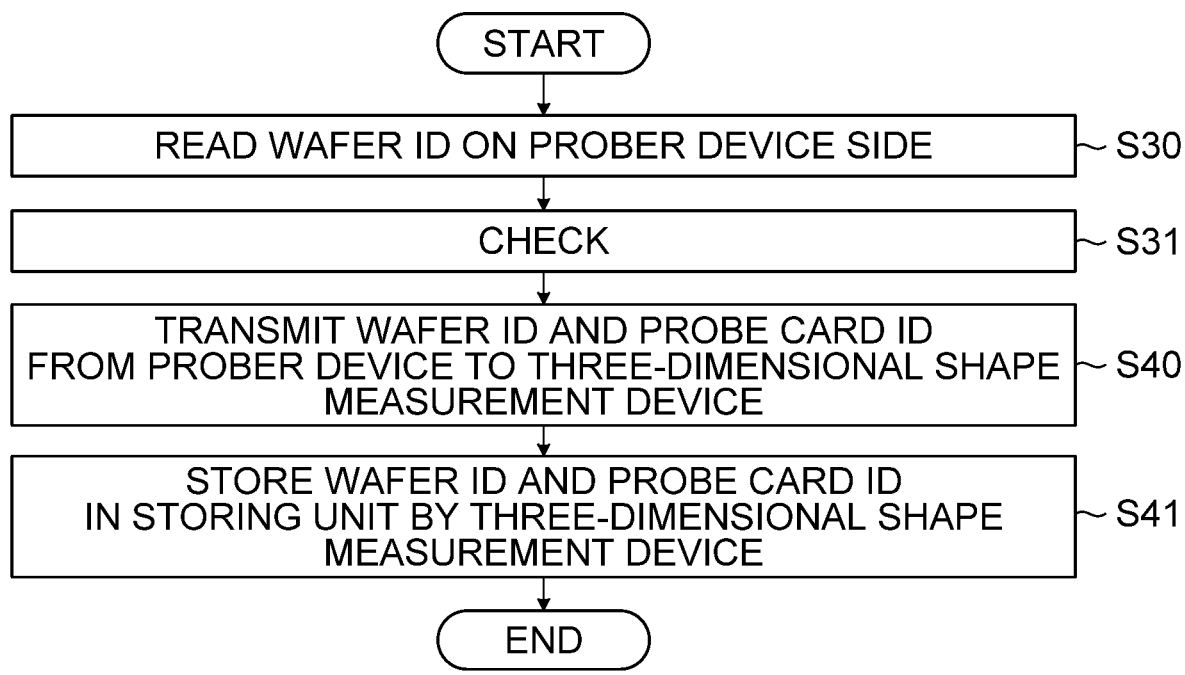
FIG. 17 is a flowchart illustrating an example of a procedure for measuring particles according to the third embodiment.
Figure 18:
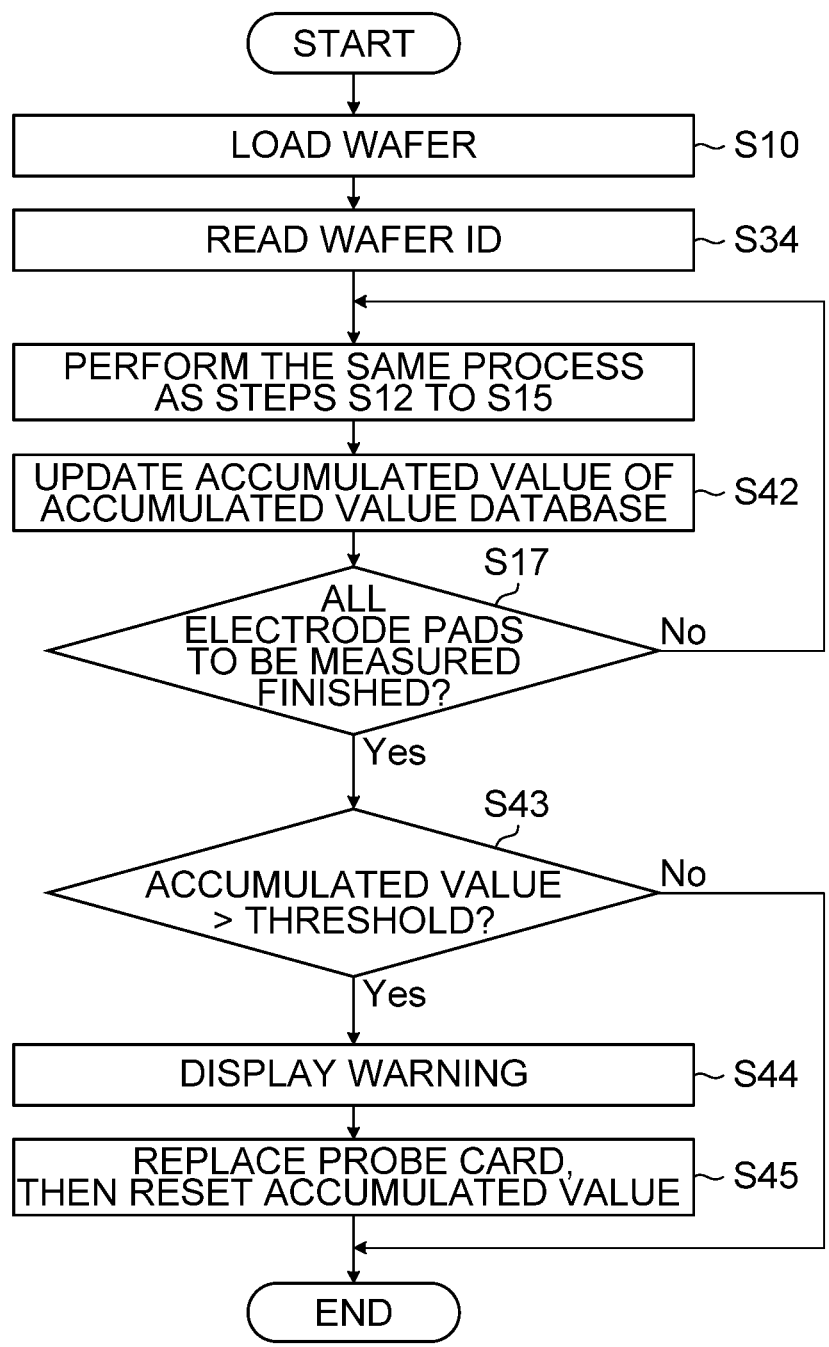
FIG. 18 is a flowchart illustrating an example of a procedure for measuring particles according to the third embodiment.

A procedure for measuring particles in the third embodiment is described with reference to FIGS. 17 and 18. Also in the third embodiment, the wafer ID is registered, as in the second embodiment. As illustrated in FIG. 17, the procedure for registering the wafer ID in the third embodiment is almost the same as the registration procedure in the second embodiment illustrated in FIG. 14. A difference is that in the second embodiment, the prober ID is transmitted and stored in steps S32 and S33 illustrated in FIG. 14, whereas in the third embodiment, the probe card ID is transmitted and stored in steps S40 and S41 illustrated in FIG. 17. The wafer ID database 340 as illustrated in FIG. 16 is created by the registration procedure.

Subsequently, the wafer W which has been subjected to checking is conveyed to the three-dimensional shape measurement device 2200 by the conveying device (not illustrated), and the particles are measured for the wafer W. As illustrated in FIG. 18, the procedure for measuring particles in the third embodiment is almost the same as the procedure for measuring particles in the second embodiment illustrated in FIG. 15. A difference is that steps S35 to S38 in FIG. 15 are changed to steps S42 to 45 in FIG. 18.

Hereinafter, only differences from the second embodiment are described. First, in step S42 in the third embodiment, the particle quantity calculating unit 255 acquires a probe card ID corresponding to the wafer ID read in step S34 with reference to the wafer ID database 340 in the storing unit 290. Furthermore, the particle quantity calculating unit 255 refers to the accumulated value database 350 in the storing unit 290, and adds the particle quantity $\Delta V$ calculated in step S15 to the accumulated value $\Sigma \Delta V$ corresponding to the acquired probe card ID to update the accumulated value $\Sigma \Delta V$.

Then, when it is determined that there is no more electrode pads P to be measured (step S17: YES), in step S43, the determining unit 256 of the controlling unit 250 determines whether the accumulated value $\Sigma \Delta V$ exceeds a predetermined third threshold. Here, the third threshold may be different from each of the first threshold and the second threshold used in the first and second embodiments. The third threshold is a preset value. The third threshold may be set as appropriate when shipped or may be set or changed as appropriate at any time by the user. When a certain amount or more of particles are accumulated, the probe card 140-$j$ reaches the end of its life and requires replacement, but the operator (or the manufacturer) can empirically know the particle quantity when the replacement of the probe card 140-$j$ becomes required based on the use experience of the probe card 140-$j$. For example, the operator sets the third threshold based on his/her experience.

Furthermore, in step S44, the determining unit 256 outputs, to the displaying unit 270, the probe card ID, the information for specifying the probe card 140-$j$ corresponding to the probe card ID, and the warning.

Upon receiving the warning, the operator replaces the probe card 140-$j$ as needed. When the replacement is performed, in step S45, the determining unit 256 resets the accumulated value $\Sigma \Delta V$ corresponding to the replaced probe card 140-$j$, the accumulated value $\Sigma \Delta V$ being stored in the accumulated value database 350, and then, the process for the wafer W ends.

The probe card has conventionally been replaced at a predetermined frequency, and therefore the probe card is replaced in some cases even when the replacement is originally unnecessary. On the other hand, according to the third embodiment, the particle quantity is managed for each probe card 140-$j$, which makes it possible to properly replace the probe card 140-$j$ requiring replacement. Therefore, the efficiency of the manufacturing process of the semiconductor can be increased.

Modified Example of Third Embodiment

The third embodiment and the second embodiment may be combined. This makes it possible to manage the prober device 2100-$i$ in which the probe card 140-$j$ is mounted. In this case, the storing unit 290 further includes, in addition to the wafer ID database 340 and the accumulated value database 350 illustrated in FIG. 16, a prober ID database (not illustrated) in which the prober ID is stored in association with the probe card ID.

In the combination of the third embodiment with the second embodiment, for example, the determining unit 256 outputs, to the displaying unit 270, a probe card ID of the probe card 140-$j$ requiring replacement, the prober ID of the prober device 2100-$i$ in which the probe card 140-$j$ is mounted, and the warning encouraging replacement of the probe card 140-$j$. Thus, also in the particle measurement system including the plurality of prober devices 2100-$i$, the probe card 140-$j$ can be properly replaced.

Fourth Embodiment

In the third embodiment, the particle quantity is managed for each probe card mounted in the prober device. Here, the particles are attached to the probe needles of the probe card, but the type of probe needle used is different for each type of wafer W, and therefore an amount of particles to be attached is different depending on the probe needle. In a fourth embodiment, the particle quantity can be managed for each probe needle as the amount of particles to be attached.

A particle measurement system according to the fourth embodiment includes the prober device 2100 according to the second embodiment and a three-dimensional shape measurement device 4200 according to the fourth embodiment. The configuration of the prober device 2100 is described above, and therefore the description thereof is omitted here.

Hereinafter, a configuration of the three-dimensional shape measurement device 4200 according to the fourth embodiment is described with reference to FIG. 19. As illustrated in FIG. 19, the three-dimensional shape measurement device 4200 according to the fourth embodiment has a configuration obtained by adding, to the three-dimensional shape measurement device 2200 according to the second embodiment, a position information acquiring unit 400 that acquires position information of the electrode pad P. Hereafter, as an example, the position information is described as XY coordinates.

Examples of a method of acquiring position information (XY coordinates) of the electrode pad P include a method of acquiring XY coordinates from a drive amount of the stage moving mechanism 230, a method of acquiring XY coordinates by the non-contact three-dimensional measuring unit 280, and a method of acquiring XY coordinates from an image of the chip C captured by a camera (not illustrated). These methods are well known in the art, and therefore, description thereof is omitted here.

The controlling unit 250 of the three-dimensional shape measurement device 4200 according to the fourth embodiment manages, in databases, a particle quantity for each probe needle 141-$k$ (k is a natural number). FIG. 20 illustrates an example of the databases stored in the storing unit 290. As illustrated in FIG. 20, the storing unit 290 includes a wafer type database 420, a needle database 430, and an accumulated value database 440.

The wafer type database 420 stores a wafer ID for identifying a wafer W and a wafer type ID for identifying the type of wafer W while associating the wafer ID with the wafer type ID. The needle database 430 stores arrangement information of the electrode pads P on the wafer W for each type of wafer W.

Specifically, the arrangement information of the electrode pads P includes, for each electrode pad P on the wafer W, a pad ID for identifying the electrode pad P, XY coordinates of the electrode pad P, and a needle ID for identifying the probe needle 141-$k$ which contacts the electrode pad P. Here, the XY coordinates may be a predetermined position of the wafer W or relative coordinates with a predetermined position of the chip C.

The wafer type database 420 and the accumulated value database 440 are previously registered with the storing unit 290 by the operator or the manufacturer, and are updated as needed. The accumulated value database 440 stores an accumulated value ΣΔV of the particle quantity for each probe needle 141-k.

Figure 21:
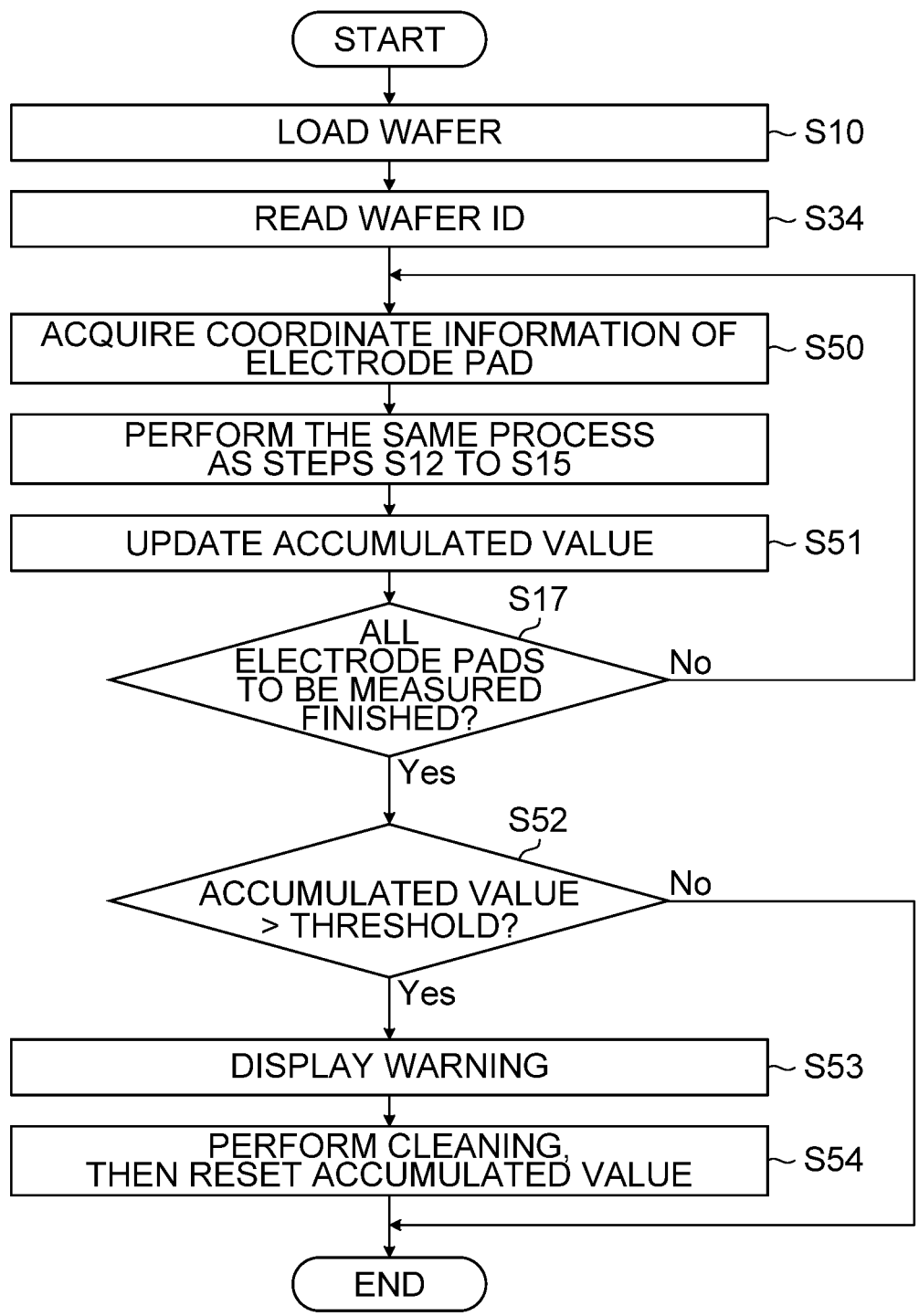
FIG. 21 is a flowchart illustrating an example of a procedure for measuring particles according to the fourth embodiment.

Next, a procedure for measuring particles in the fourth embodiment is described with reference to FIG. 21. The procedure for measuring particles in the fourth embodiment is almost the same as the procedure for measuring particles in the second embodiment, but is different from the second embodiment in that step S50 is added after step S34 in FIG. 15, and steps S51 to S54 are performed instead of steps S35 to S38 in FIG. 15.

Hereinafter, only differences from the second embodiment are described. In the fourth embodiment, after the wafer ID is read in step S34, in step S50, the position information acquiring unit 400 acquires the XY coordinates of the electrode pad P to be measured. Here, the XY coordinates to be acquired may be a relative position with the same position as the XY coordinates stored in the wafer type database 420 in the storing unit 290.

Subsequently, after steps S12 to S15 are performed, in step S51, the particle quantity calculating unit 255 acquires the wafer type ID associated with the wafer ID read in step S34 from the wafer type database 420 in the storing unit 290. Furthermore, the particle quantity calculating unit 255 refers to the needle database 430, and acquires the needle ID for identifying the probe needle 141-k which contacts the electrode pad P having the XY coordinates acquired in step S50, based on the arrangement information of the electrode pad P corresponding to the wafer type ID. Furthermore, the particle quantity calculating unit 255 refers to the accumulated value database 440, and adds the particle quantity ΔV calculated in step S15 to the accumulated value ΣΔV corresponding to the acquired needle ID to update the accumulated value ΣΔV (step S51).

Then, when it is determined that there is no more electrode pads P to be measured (step S17: YES), the determining unit 256 determines whether the accumulated value ΣΔV calculated in step S51 exceeds a predetermined fourth threshold (step S52). Here, the fourth threshold may be different from each of the first to third threshold used in the first to third embodiments. The fourth threshold is a preset value, and may be set as appropriate when shipped or may be set or changed as appropriate at any time by the user. When a certain amount or more of particles are attached to the probe needle 141-k, it may affect the checking of the wafer W, but the operator (or the manufacturer) can empirically know the particle quantity which may affect the checking based on the use experience of the prober device 2100-i. Therefore, the operator may set the fourth threshold based on his/her experience.

When it is determined that the accumulated value ΣΔV exceeds the predetermined fourth threshold (step S52: YES), the determining unit 256 outputs, to the displaying unit 270, the coordinates of the electrode pad P acquired in step S50, the information for specifying the probe needle 141-k corresponding to the coordinates, and the warning (step S53). Upon receiving the warning, the operator cleans the probe card 140 as needed (step S54).

To date, there was no method of quantitatively managing a particle quantity for each probe needle 141-k. On the other hand, according to the fourth embodiment of the presently disclosed subject matter, the particle quantity can be quantitatively managed for each probe needle 141-k, which makes it possible to properly clean the probe needle 141-k requiring cleaning when the probe card 140 is cleaned. This makes it possible to efficiently clean the probe card 140, and therefore the efficiency of the manufacturing process of the semiconductor can be increased.

[Determination of Electrode Pad to be Measured]

In the above-described first to fourth embodiments, the particles are measured for the electrode pad P to be measured. The operator (or the manufacturer) can optionally determine the electrode pad P to be measured. For example, all the electrode pads P on the wafer W may be the electrode pads to be measured or some of all the electrode pads P may be sampled as the electrode pads to be measured. When some of all the electrode pads P are to be measured, the information about sampling of the electrode pads P to be measured is previously stored in the storing unit 290 in the three-dimensional shape measurement device 200, 2200, 4200 according to each embodiment. Sampling the electrode pads P enables a reduction in time required for particle measurement, and therefore the efficiency of the manufacturing process of the semiconductor can be further increased.

When some of all the electrode pads P are to be measured, the electrode pads P may be randomly sampled or the electrode pads P may be sampled according to any rule according to the operator's needs. Hereinafter, there is described an example of a method of sampling electrode pads P according to the rule.

[First Sampling Method]

Figure 22:
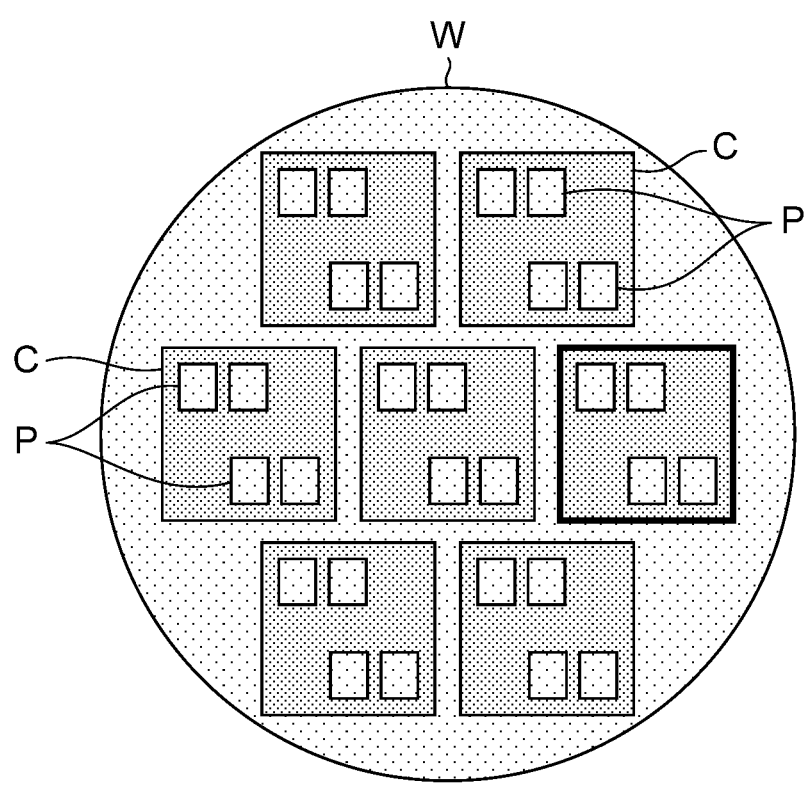
FIG. 22 is a diagram illustrating an example of a method of sampling electrode pads.

First, a first sampling method is described with reference to FIG. 22. Although a plurality of chips are placed on the wafer W, in the first sampling method, all the electrode pads P included in a specific chip C on the wafer W are sampled as the electrode pads to be measured. For example, in the example illustrated in FIG. 22, all of four electrode pads P included in the specific chip C indicated by a thick solid line among a plurality of chips C on the wafer W are sampled as the electrode pads to be measured. In FIG. 22, only one chip C is illustrated as the specific chip C, but the plurality of chips C may, of course, be determined as the specific chips C.

According to the first sampling method, the particles are measured for all the electrode pads P included in the specific chip C on the wafer W, and therefore the electrode pads P are uniformly sampled on the entire chip C. Furthermore, the particle quantity over the entire wafer W can be estimated with high accuracy.

[Second Sampling Method]

Next, a second sampling method is described with reference to FIG. 23. Although a plurality of chips C are placed on the wafer W, in the probing operation by the prober device 100, 2100, 2100-i, the probing operation may not be able to be performed at a time over the entire wafer W. In this case, the probing operations are performed a plurality of times, but in the second sampling method, all the contacted electrode pads P in one or more specific probing operations among the plurality of probing operations are sampled as the electrode pads P to be measured.

Figure 23:
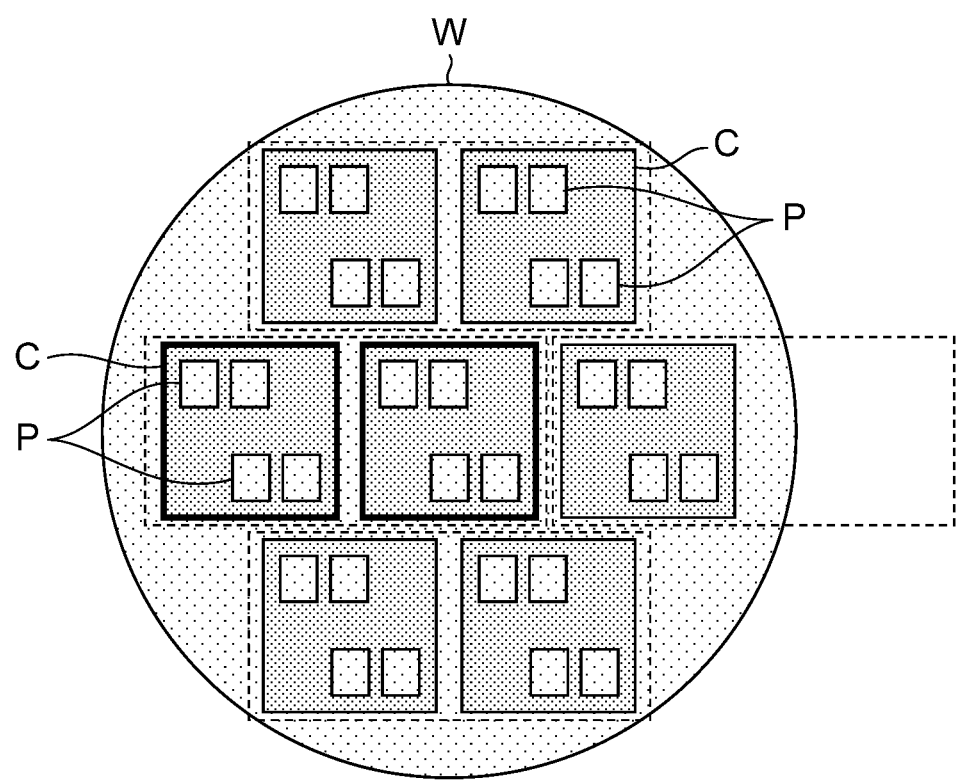
FIG. 23 is a diagram illustrating a further example of a method of sampling electrode pads.

FIG. 23 illustrates an example of sampling when the probe card 140 mounted in the prober device 100, 2100, 2100-i can simultaneously perform the probing operations for the two chips C. In FIG. 23, a range of a single probing operation is surrounded by a broken line, and the two chips C are included in the range. Since seven chips C are placed on the wafer W, it is necessary to perform the probing operations four times. In the example illustrated in FIG. 23, all the eight contacted electrode pads P in a single specific probing operation among the four probing operations are sampled as the electrode pads to be measured. Note that in FIG. 23, only the contacted electrode pads P in a single probing operation are sampled, but the contacted electrode pads P in the plurality of probing operations may, of course, be sampled as the electrode pads to be measured.

According to the second sampling method, the particles are measured for all the contacted electrode pads P in a single probing operation, and therefore the particle quantity over the entire wafer W can be estimated with high accuracy even when the particle quantity varies depending on the probe needle 141.

[Third Sampling Method]

Next, a third sampling method is described with reference to FIG. 24. For example, when the probe needle 141 is a cantilevered probe needle, all the probe needles 141 may not contact their corresponding electrode pads P from the same direction. In the third sampling method, a certain proportion of electrode pads P for each contacting direction among all the electrode pads P are sampled as the electrode pads to be measured.

Figure 24:
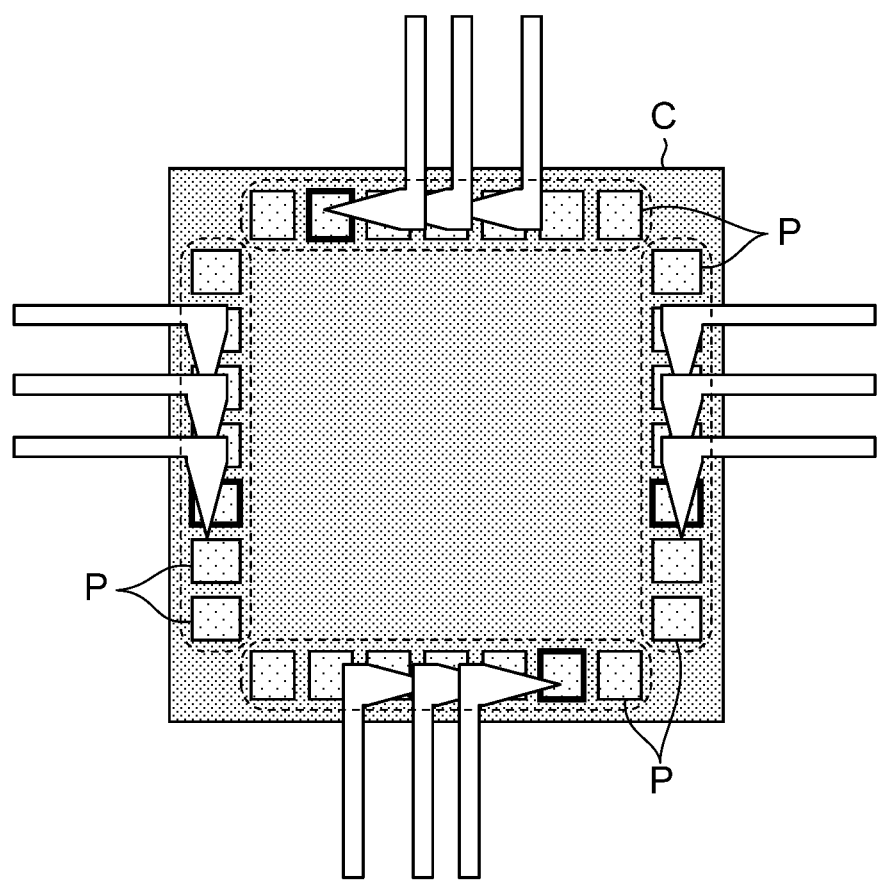
FIG. 24 is a diagram illustrating a further example of a method of sampling electrode pads.

FIG. 24 illustrates an example of sampling when a plurality of probe needles 141 contact a plurality of electrode pads P on the chip C from a plurality of different directions. In the example illustrated in FIG. 24, three probe needles 141 (twelve probe needles 141 in total) from each of up, down, right, and left directions contact the electrode pads P, respectively. In FIG. 24, the probe needles 141 contacting the electrode pads P from the same direction are surrounded by a broken line.

In the example illustrated in FIG. 24, one electrode pad P contacted from each of up, down, right, and left directions is sampled as the electrode pad to be measured. In FIG. 24, the electrode pads P sampled as the electrode pads to be measured are indicated by thick solid lines. By this sampling, the electrode pads corresponding to one third of all the probe needles 141 become the electrode pads to be measured.

In FIG. 24, one electrode pad P (one third) for each of contacting directions is sampled as the electrode pad to be measured, but a plurality of electrode pads P for each direction may, of course, be sampled as the electrode pads to be measured.

The contact state between the probe needle 141 and the electrode pad P is determined by the relative posture relationship between the wafer W and the probe needle 141 and the motion direction. Therefore, the particle quantity is likely to be affected by the direction in which the probe needle 141 contacts the electrode pad P. Then, by sampling a certain proportion of electrode pads P from each of a plurality of contacting directions, the distribution of the measurement result of the particle quantity in each contacting direction can be reduced. Thus, the particle quantity over the entire wafer W can be estimated with high accuracy.

Advantageous Effects of Invention

As described above, according to the first embodiment, the particle quantity generated from the wafer W can be quantitatively managed. Furthermore, the warning is output when the particle quantity exceeds the predetermined threshold, and therefore the operator can properly clean the wafer W requiring cleaning. Therefore, the efficiency of the manufacturing process of the semiconductor can be increased.

Here, by adding functions of the non-contact three-dimensional measuring unit 280 and the controlling unit 250 to the prober device 100, the prober device 100 and the particle measurement device can be accomplished by a single device. Therefore, the particle measurement device can be manufactured at low cost. Furthermore, it is not necessary to convey the wafer W from the prober device 100 to the three-dimensional shape measurement device 200 and load the wafer W into the three-dimensional shape measurement device 200, which makes it possible to efficiently measure the particles. Furthermore, recipes (various parameters such as the size of the wafer W and the arrangement of the chips) used when the wafer W is checked can be taken over and used, which makes it possible to measure the particles more efficiently.

According to the second embodiment, the controlling unit 250 quantitatively manages the particle quantity generated from the wafer W for each prober device 2100-$i$, and outputs the information for specifying the prober device 2100-$i$ in which the particle quantity exceeds the predetermined threshold, and the warning. This enables the operator to properly clean the prober device 2100-$i$ or the probe needle 141 requiring cleaning. Therefore, the efficiency of the manufacturing process of the semiconductor can be increased.

According to the third embodiment, the controlling unit 250 manages the particle quantity for each probe card 140-$j$, and outputs the information for specifying the probe card 140-$j$ in which the particle quantity exceeds the predetermined threshold, and the warning. Thus, the probe card 140-$j$ requiring replacement can be properly replaced. Therefore, the efficiency of the manufacturing process of the semiconductor can be increased.

According to the fourth embodiment, the controlling unit 250 quantitatively manages the particle quantity for each probe needle 141-$k$, and outputs the information for specifying the probe needle 141-$k$ in which the particle quantity exceeds the predetermined threshold, and the warning. Thus, the probe needle 141-$k$ requiring cleaning can be properly cleaned when the probe card 140 is cleaned. The probe card 140 can be efficiently cleaned, and therefore the efficiency of the manufacturing process of the semiconductor can be increased.

Here, each embodiment may be combined. For example, the third embodiment and the second embodiment may be combined. This makes it possible to manage the prober device 2100-$i$ in which the probe card 140-$j$ is mounted.

In each embodiment, all the electrode pads P included in the chip C on the wafer W may be the electrode pads to be measured or some of all the electrode pads P may be sampled as the electrode pads to be measured. Sampling the electrode pads P enables a reduction in time required for particle measurement, and therefore the efficiency of the manufacturing process of the semiconductor can be further increased.

Although the examples of the presently disclosed subject matter have been described above, it is needless to say that the presently disclosed subject matter is not limited to the above-described embodiments, and various modifications may be made without departing from the spirit of the invention.

REFERENCE SIGNS LIST 100, 2100, 2100-$i$: Prober device, 120, 220: Stage, 230: Stage moving mechanism, 140, 140-$j$: Probe card, 141, 141-$k$: Probe needle, 150, 250: Controlling unit, 160, 260: Operating unit, 170, 270: Displaying unit, 180: Test head, 200, 2200, 4200: Three-dimensional shape measurement device, 251: Three-dimensional measurement controlling unit, 252: Acquiring unit, 253: Detecting unit, 254: Roughness calculating unit, 255: Particle quantity calculating unit, 256: Determining unit, 290: Storing unit, 300, 310: Wafer ID reading unit, 320, 340: Wafer ID database, 330, 350, 440:

Accumulated value database, 400: Position information acquiring unit, 420: Wafer type database, 430: Needle database, 1000, 2000: Particle measurement system, C: Chip, M: Probe needle mark, P: Electrode pad, W: Wafer, R: Pad reference surface, RM: Needle mark region

What is claimed is:

1. A particle measurement device configured to measure particles generated when a probe needle contacts an electrode pad of a wafer to check electrical characteristics of the wafer, the device comprising:
    an acquiring unit configured to acquire pad surface shape data indicating a surface shape of the electrode pad including a probe needle mark where the probe needle has contacted;
    a detecting unit configured to detect a pad reference surface as a reference for measurement of the particles from a surface of the electrode pad based on the pad surface shape data acquired by the acquiring unit;
    a roughness calculating unit configured to calculate volume of a recessed portion recessed from the pad reference surface in the surface shape of the electrode pad and volume of a protruding portion protruding from the pad reference surface based on the pad surface shape data acquired by the acquiring unit; and
    a particle quantity calculating unit configured to calculate a particle quantity from a volume difference between the volume of the recessed portion and the volume of the protruding portion which are calculated by the roughness calculating unit.

2. The particle measurement device according to claim 1, further comprising:
    a first accumulating unit configured to accumulate particle quantities calculated by the particle quantity calculating unit for a plurality of the electrode pads included in the wafer; and
    a first outputting unit configured to output information indicating a possibility that an abnormality occurs in a check result based on a result obtained by comparing a particle accumulated value accumulated by the first accumulating unit and a first threshold.

3. The particle measurement device according to claim 2, further comprising:
    a second accumulating unit configured to accumulate a particle quantity for each prober device which has checked the electrical characteristics of the wafer; and
    a second outputting unit configured to output information indicating a prober device having a possibility that an abnormality occurs in a check result based on a result obtained by comparing a particle accumulated value accumulated for each prober device by the second accumulating unit and a second threshold.

4. The particle measurement device according to claim 3, further comprising:
    a third accumulating unit configured to accumulate a particle quantity for each probe card used to check the electrical characteristics of the wafer; and
    a third outputting unit configured to output information indicating a probe card having a possibility that an abnormality occurs in a check result based on a result obtained by comparing a particle accumulated value accumulated for each probe card by the third accumulating unit and a third threshold.

5. The particle measurement device according to claim 4, further comprising:
    a fourth accumulating unit configured to accumulate a particle quantity for each probe needle included in a probe card used to check the electrical characteristics of the wafer; and
    a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

6. The particle measurement device according to claim 3, further comprising:
    a fourth accumulating unit configured to accumulate a particle quantity for each probe needle included in a probe card used to check the electrical characteristics of the wafer; and
    a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

7. The particle measurement device according to claim 2, further comprising:
    a third accumulating unit configured to accumulate a particle quantity for each probe card used to check the electrical characteristics of the wafer; and
    a third outputting unit configured to output information indicating a probe card having a possibility that an abnormality occurs in a check result based on a result obtained by comparing a particle accumulated value accumulated for each probe card by the third accumulating unit and a third threshold.

8. The particle measurement device according to claim 7, further comprising:
    a fourth accumulating unit configured to accumulate a particle quantity for each probe needle included in a probe card used to check the electrical characteristics of the wafer; and
    a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

9. The particle measurement device according to claim 2, further comprising:
    a fourth accumulating unit configured to accumulate a particle quantity for each probe needle included in a probe card used to check the electrical characteristics of the wafer; and
    a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

10. The particle measurement device according to claim 1, further comprising:
    a second accumulating unit configured to accumulate a particle quantity for each prober device which has checked the electrical characteristics of the wafer; and
    a second outputting unit configured to output information indicating a prober device having a possibility that an abnormality occurs in a check result based on a result obtained by comparing a particle accumulated value accumulated for each prober device by the second accumulating unit and a second threshold.

11. The particle measurement device according to claim 10, further comprising:
a third accumulating unit configured to accumulate a particle quantity for each probe card used to check the electrical characteristics of the wafer; and
a third outputting unit configured to output information indicating a probe card having a possibility that an abnormality occurs in a check result based on a result obtained by comparing a particle accumulated value accumulated for each probe card by the third accumulating unit and a third threshold.

12. The particle measurement device according to claim 11, further comprising:
a fourth accumulating unit configured to accumulate a particle quantity for each probe needle included in a probe card used to check the electrical characteristics of the wafer; and
a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

13. The particle measurement device according to claim 10, further comprising:
a fourth accumulating unit configured to accumulate a particle quantity for each probe needle included in a probe card used to check the electrical characteristics of the wafer; and
a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

14. The particle measurement device according to claim 1, further comprising:
a third accumulating unit configured to accumulate a particle quantity for each probe card used to check the electrical characteristics of the wafer; and
a third outputting unit configured to output information indicating a probe card having a possibility that an abnormality occurs in a check result based on a result obtained by comparing a particle accumulated value accumulated for each probe card by the third accumulating unit and a third threshold.

15. The particle measurement device according to claim 14, further comprising:
a fourth accumulating unit configured to accumulate a particle quantity for each probe needle included in a probe card used to check the electrical characteristics of the wafer; and
a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

16. The particle measurement device according to claim 1, further comprising:
a fourth accumulating unit configured to accumulate a particle quantity for each probe needle included in a probe card used to check the electrical characteristics of the wafer; and
a fourth outputting unit configured to output information indicating a probe needle having a possibility that an abnormality occurs in a check result based on a result obtained by comparing a particle accumulated value accumulated for each probe needle by the fourth accumulating unit and a fourth threshold.

17. A three-dimensional shape measurement device, comprising:
a non-contact three-dimensional measuring unit configured to create pad surface shape data indicating a surface shape of an electrode pad including a probe needle mark where a probe needle has contacted; and
the particle measurement device according to claim 1.

18. A prober device, comprising:
a non-contact three-dimensional measuring unit configured to create pad surface shape data indicating a surface shape of an electrode pad including a probe needle mark where a probe needle has contacted; and
the particle measurement device according to claim 1.

19. A particle measurement system, comprising:
one or more prober devices configured to bring a probe needle into contact with an electrode pad of a wafer to check electrical characteristics of the wafer;
a non-contact three-dimensional measurement device configured to create pad surface shape data indicating a surface shape of the electrode pad including a probe needle mark where the probe needle has contacted; and
the particle measurement device according to claim 1.

20. A particle measurement method of measuring particles generated when a probe needle contacts an electrode pad of a wafer to check electrical characteristics of the wafer, the method comprising:
acquiring pad surface shape data indicating a surface shape of the electrode pad including a probe needle mark where the probe needle has contacted;
detecting a pad reference surface as a reference for measurement of the particles from a surface of the electrode pad based on the pad surface shape data;
calculating volume of a recessed portion recessed from the pad reference surface in the surface shape of the electrode pad and volume of a protruding portion protruding from the pad reference surface based on the pad surface shape data; and
calculating a particle quantity from a volume difference between the volume of the recessed portion and the volume of the protruding portion.

* * * * *